(12) United States Patent
Hendricks et al.

(10) Patent No.: US 12,400,856 B2
(45) Date of Patent: Aug. 26, 2025

(54) METHODS OF FORMING NANOSTRUCTURES INCLUDING METAL OXIDES USING BLOCK COPOLYMER MATERIALS

(71) Applicant: Micron Technology, Inc., Boise, ID (US)

(72) Inventors: Nicholas Hendricks, Boise, ID (US); Adam L. Olson, Boise, ID (US); William R. Brown, Boise, ID (US); Ho Seop Eom, Boise, ID (US); Xue Chen, Boise, ID (US); Kaveri Jain, Boise, ID (US); Scott Schuldenfrei, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/062,495

(22) Filed: Dec. 6, 2022

(65) Prior Publication Data
US 2023/0116129 A1    Apr. 13, 2023

Related U.S. Application Data

(62) Division of application No. 16/049,329, filed on Jul. 30, 2018, now Pat. No. 11,532,477, which is a
(Continued)

(51) Int. Cl.
*H01L 21/027* (2006.01)
*B81C 1/00* (2006.01)
(Continued)

(52) U.S. Cl.
CPC ...... *H01L 21/0273* (2013.01); *B81C 1/00031* (2013.01); *C08G 81/00* (2013.01);
(Continued)

(58) Field of Classification Search
CPC ........... H01L 21/02318; H01L 21/0337; H01L 21/31058; H01L 21/0273; H01L 21/0332;
(Continued)

(56) References Cited

U.S. PATENT DOCUMENTS

| 4,623,674 A | 11/1986 | Bailey, Jr. |
| 4,797,357 A | 1/1989 | Mura et al. |

(Continued)

FOREIGN PATENT DOCUMENTS

| CN | 1562730 A | 1/2005 |
| CN | 1799131 A | 7/2006 |

(Continued)

OTHER PUBLICATIONS

Fasolka et al., Morphology of Ultrathin Supported Diblock Copolymer Films: Theory and Experiment, Macromolecules, vol. 33, No. 15, (2000), pp. 5702-5712.

(Continued)

*Primary Examiner* — Vongsavanh Sengdara
(74) *Attorney, Agent, or Firm* — TraskBritt

(57) ABSTRACT

A self-assembled nanostructure comprises first domains and second domains. The first domains comprise a first block of a block copolymer material and an activatable catalyst. The second domains comprise a second block and substantially without the activatable catalyst. The activatable catalyst is capable of generating catalyst upon application of activation energy, and the generated catalyst is capable of reacting with a metal oxide precursor to provide a metal oxide. A semiconductor structure comprises such self-assembled nanostructure on a substrate.

18 Claims, 10 Drawing Sheets

Related U.S. Application Data division of application No. 14/920,018, filed on Oct. 22, 2015, now Pat. No. 10,049,874, which is a division of application No. 14/040,245, filed on Sep. 27, 2013, now Pat. No. 9,177,795.

(51) Int. Cl.

| | | |
|---|---|---|
| C08G 81/00 | (2006.01) | |
| C08L 53/00 | (2006.01) | |
| H01L 21/02 | (2006.01) | |
| H01L 21/033 | (2006.01) | |
| H01L 21/3105 | (2006.01) | |

(52) U.S. Cl.
CPC ...... *C08L 53/005* (2013.01); *H01L 21/02118* (2013.01); *H01L 21/02175* (2013.01); *H01L 21/02318* (2013.01); *H01L 21/0332* (2013.01); *H01L 21/0337* (2013.01); *H01L 21/31058* (2013.01); *B81C 2201/0149* (2013.01)

(58) Field of Classification Search
CPC ......... H01L 21/02175; H01L 21/02118; C08L 53/005; C08G 81/00; B81C 1/00031
See application file for complete search history.

(56) References Cited

U.S. PATENT DOCUMENTS

| | | |
|---|---|---|
| 4,818,713 A | 4/1989 | Feygenson |
| 4,877,647 A | 10/1989 | Klabunde |
| 5,328,810 A | 7/1994 | Lowrey et al. |
| 5,374,367 A | 12/1994 | Edamura et al. |
| 5,382,373 A | 1/1995 | Carlson et al. |
| 5,482,656 A | 1/1996 | Hiraoka et al. |
| 5,512,131 A | 4/1996 | Kumar et al. |
| 5,538,655 A | 7/1996 | Fauteux et al. |
| 5,580,700 A | 12/1996 | Rahman |
| 5,620,850 A | 4/1997 | Bamdad et al. |
| 5,622,668 A | 4/1997 | Thomas et al. |
| 5,772,905 A | 6/1998 | Chou |
| 5,834,583 A | 11/1998 | Hancock et al. |
| 5,849,810 A | 12/1998 | Beat |
| 5,866,297 A | 2/1999 | Barjesteh et al. |
| 5,879,582 A | 3/1999 | Havelka et al. |
| 5,879,853 A | 3/1999 | Azuma |
| 5,891,356 A | 4/1999 | Inoue et al. |
| 5,904,824 A | 5/1999 | Oh |
| 5,925,259 A | 7/1999 | Biebuyck et al. |
| 5,948,470 A | 9/1999 | Harrison et al. |
| 5,958,704 A | 9/1999 | Starzl et al. |
| 6,051,869 A | 4/2000 | Pan et al. |
| 6,111,323 A | 8/2000 | Carter et al. |
| 6,143,647 A | 11/2000 | Pan et al. |
| 6,153,495 A | 11/2000 | Kub et al. |
| 6,207,787 B1 | 3/2001 | Fahey et al. |
| 6,251,791 B1 | 6/2001 | Tsai et al. |
| 6,270,946 B1 | 8/2001 | Miller |
| 6,309,580 B1 | 10/2001 | Chou |
| 6,310,138 B1 | 10/2001 | Yonezawa et al. |
| 6,312,971 B1 | 11/2001 | Amundson et al. |
| 6,368,871 B1 | 4/2002 | Christel et al. |
| 6,403,382 B1 | 6/2002 | Zhu et al. |
| 6,414,164 B1 | 7/2002 | Afzali-Ardakani et al. |
| 6,423,465 B1 | 7/2002 | Hawker et al. |
| 6,423,474 B1 | 7/2002 | Holscher |
| 6,503,841 B1 | 1/2003 | Criscuolo et al. |
| 6,506,660 B2 | 1/2003 | Holmes et al. |
| 6,517,933 B1 | 2/2003 | Soane et al. |
| 6,518,194 B2 | 2/2003 | Winningham et al. |
| 6,537,920 B1 | 3/2003 | Krivokapic |
| 6,548,830 B1 | 4/2003 | Noguchi et al. |
| 6,565,763 B1 | 5/2003 | Asakawa et al. |
| 6,565,764 B2 | 5/2003 | Hiraoka et al. |
| 6,566,248 B1 | 5/2003 | Wang et al. |
| 6,569,528 B2 | 5/2003 | Nam et al. |
| 6,573,030 B1 | 6/2003 | Fairbairn et al. |
| 6,592,764 B1 | 7/2003 | Stucky et al. |
| 6,630,520 B1 | 10/2003 | Bruza et al. |
| 6,635,912 B2 | 10/2003 | Ohkubo |
| 6,656,308 B2 | 12/2003 | Hougham et al. |
| 6,679,996 B1 | 1/2004 | Yao |
| 6,682,660 B2 | 1/2004 | Sucholeiki et al. |
| 6,689,473 B2 | 2/2004 | Guire et al. |
| 6,699,797 B1 | 3/2004 | Morris et al. |
| 6,713,238 B1 | 3/2004 | Chou et al. |
| 6,746,825 B2 | 6/2004 | Nealey et al. |
| 6,767,693 B1 | 7/2004 | Okoroanyanwu |
| 6,780,492 B2 | 8/2004 | Hawker et al. |
| 6,781,166 B2 | 8/2004 | Lieber et al. |
| 6,797,202 B2 | 9/2004 | Endo et al. |
| 6,809,210 B2 | 10/2004 | Chandross et al. |
| 6,812,132 B2 | 11/2004 | Ramachandrarao et al. |
| 6,825,358 B2 | 11/2004 | Afzali-Ardakani et al. |
| 6,884,842 B2 | 4/2005 | Soane et al. |
| 6,887,332 B1 | 5/2005 | Kagan et al. |
| 6,890,624 B1 | 5/2005 | Kambe et al. |
| 6,890,703 B2 | 5/2005 | Hawker et al. |
| 6,908,861 B2 | 6/2005 | Sreenivasan et al. |
| 6,911,400 B2 | 6/2005 | Colburn et al. |
| 6,913,697 B2 | 7/2005 | Lopez et al. |
| 6,924,341 B2 | 8/2005 | Mays et al. |
| 6,926,953 B2 | 8/2005 | Nealey et al. |
| 6,940,485 B2 | 9/2005 | Noolandi |
| 6,946,332 B2 | 9/2005 | Loo et al. |
| 6,949,456 B2 | 9/2005 | Kumar |
| 6,952,436 B2 | 10/2005 | Wirnsberger et al. |
| 6,957,608 B1 | 10/2005 | Hubert et al. |
| 6,962,823 B2 | 11/2005 | Empedocles et al. |
| 6,989,426 B2 | 1/2006 | Hu et al. |
| 6,992,115 B2 | 1/2006 | Hawker et al. |
| 6,995,439 B1 | 2/2006 | Hill et al. |
| 6,998,152 B2 | 2/2006 | Uhlenbrock |
| 7,001,795 B2 | 2/2006 | Jiang et al. |
| 7,009,227 B2 | 3/2006 | Patrick et al. |
| 7,030,495 B2 | 4/2006 | Colburn et al. |
| 7,037,738 B2 | 5/2006 | Sugiyama et al. |
| 7,037,744 B2 | 5/2006 | Colburn et al. |
| 7,045,851 B2 | 5/2006 | Black et al. |
| 7,056,455 B2 | 6/2006 | Matyjaszewski et al. |
| 7,056,849 B2 | 6/2006 | Wan et al. |
| 7,060,774 B2 | 6/2006 | Sparrowe et al. |
| 7,066,801 B2 | 6/2006 | Balijepalli et al. |
| 7,077,992 B2 | 7/2006 | Sreenivasan et al. |
| 7,087,267 B2 | 8/2006 | Breen et al. |
| 7,090,784 B2 | 8/2006 | Asakawa et al. |
| 7,112,617 B2 | 9/2006 | Kim et al. |
| 7,115,305 B2 | 10/2006 | Bronikowski et al. |
| 7,115,525 B2 | 10/2006 | Abatchev et al. |
| 7,115,995 B2 | 10/2006 | Wong |
| 7,118,784 B1 | 10/2006 | Xie |
| 7,119,321 B2 | 10/2006 | Quinlan |
| 7,132,370 B2 | 11/2006 | Paraschiv et al. |
| 7,135,144 B2 | 11/2006 | Christel et al. |
| 7,135,241 B2 | 11/2006 | Ferraris et al. |
| 7,135,388 B2 | 11/2006 | Ryu et al. |
| 7,135,523 B2 | 11/2006 | Ho et al. |
| 7,151,209 B2 | 12/2006 | Empedocles et al. |
| 7,163,712 B2 | 1/2007 | Chilkoti et al. |
| 7,166,304 B2 | 1/2007 | Harris et al. |
| 7,172,953 B2 | 2/2007 | Lieber et al. |
| 7,186,613 B2 | 3/2007 | Kirner et al. |
| 7,189,430 B2 | 3/2007 | Ajayan et al. |
| 7,189,435 B2 | 3/2007 | Tuominen et al. |
| 7,190,049 B2 | 3/2007 | Tuominen et al. |
| 7,195,733 B2 | 3/2007 | Rogers et al. |
| 7,202,308 B2 | 4/2007 | Boussand et al. |
| 7,208,836 B2 | 4/2007 | Manning |
| 7,252,791 B2 | 8/2007 | Wasserscheid et al. |
| 7,259,101 B2 | 8/2007 | Zurcher et al. |
| 7,279,396 B2 | 10/2007 | Derderian et al. |
| 7,282,240 B1 | 10/2007 | Jackman et al. |
| 7,291,284 B2 | 11/2007 | Mirkin et al. |
| 7,311,943 B2 | 12/2007 | Jacobson et al. |

(56) References Cited

U.S. PATENT DOCUMENTS

| | | | |
|---|---|---|---|
| 7,326,514 B2 | 2/2008 | Dai et al. |
| 7,332,370 B2 | 2/2008 | Chang et al. |
| 7,332,627 B2 | 2/2008 | Chandross et al. |
| 7,338,275 B2 | 3/2008 | Choi et al. |
| 7,347,953 B2 | 3/2008 | Black et al. |
| 7,368,314 B2 | 5/2008 | Ufert |
| 7,407,887 B2 | 8/2008 | Guo |
| 7,408,186 B2 | 8/2008 | Merkulov et al. |
| 7,419,772 B2 | 9/2008 | Watkins et al. |
| 7,470,954 B2 | 12/2008 | Lee et al. |
| 7,514,339 B2 | 4/2009 | Yang et al. |
| 7,521,090 B1 | 4/2009 | Cheng et al. |
| 7,553,760 B2 | 6/2009 | Yang et al. |
| 7,569,855 B2 | 8/2009 | Lai |
| 7,585,741 B2 | 9/2009 | Manning |
| 7,592,247 B2 | 9/2009 | Yang et al. |
| 7,605,081 B2 | 10/2009 | Yang et al. |
| 7,632,544 B2 | 12/2009 | Ho et al. |
| 7,655,383 B2 | 2/2010 | Mela et al. |
| 7,658,773 B2 | 2/2010 | Pinnow |
| 7,700,157 B2 | 4/2010 | Bronikowski et al. |
| 7,723,009 B2 | 5/2010 | Sandhu et al. |
| 7,767,099 B2 | 8/2010 | Li et al. |
| 7,799,416 B1 | 9/2010 | Chan et al. |
| 7,888,228 B2 | 2/2011 | Blanchard |
| 7,959,975 B2 | 6/2011 | Millward |
| 7,964,107 B2 | 6/2011 | Millward |
| 8,039,196 B2 | 10/2011 | Kim et al. |
| 8,080,615 B2 | 12/2011 | Millward |
| 8,083,953 B2 | 12/2011 | Millward et al. |
| 8,083,958 B2 | 12/2011 | Li et al. |
| 8,097,175 B2 | 1/2012 | Millward et al. |
| 8,101,261 B2 | 1/2012 | Millward et al. |
| 8,114,300 B2 | 2/2012 | Millward |
| 8,114,301 B2 | 2/2012 | Millward et al. |
| 8,114,306 B2 | 2/2012 | Cheng et al. |
| 8,206,601 B2 | 6/2012 | Bosworth et al. |
| 8,287,749 B2 | 10/2012 | Hasegawa et al. |
| 8,294,139 B2 | 10/2012 | Marsh et al. |
| 8,372,295 B2 | 2/2013 | Millward |
| 8,394,483 B2 | 3/2013 | Millward |
| 8,404,124 B2 | 3/2013 | Millward et al. |
| 8,409,449 B2 | 4/2013 | Millward et al. |
| 8,425,982 B2 | 4/2013 | Regner |
| 8,426,313 B2 | 4/2013 | Millward et al. |
| 8,445,592 B2 | 5/2013 | Millward |
| 8,455,082 B2 | 6/2013 | Millward |
| 8,512,846 B2 | 8/2013 | Millward |
| 8,513,359 B2 | 8/2013 | Millward |
| 8,518,275 B2 | 8/2013 | Millward et al. |
| 8,551,808 B2 | 10/2013 | Marsh et al. |
| 8,557,128 B2 | 10/2013 | Millward |
| 8,609,221 B2 | 12/2013 | Millward et al. |
| 8,633,112 B2 | 1/2014 | Millward et al. |
| 8,641,914 B2 | 2/2014 | Regner |
| 8,642,157 B2 | 2/2014 | Millward et al. |
| 8,669,645 B2 | 3/2014 | Millward et al. |
| 8,753,738 B2 | 6/2014 | Millward et al. |
| 8,784,974 B2 | 7/2014 | Millward |
| 8,785,559 B2 | 7/2014 | Millward |
| 8,801,894 B2 | 8/2014 | Millward |
| 8,808,557 B1 | 8/2014 | Seino et al. |
| 8,900,963 B2 | 12/2014 | Sills et al. |
| 8,956,713 B2 | 2/2015 | Millward |
| 8,993,088 B2 | 3/2015 | Millward et al. |
| 8,999,492 B2 | 4/2015 | Millward et al. |
| 9,087,699 B2 | 7/2015 | Millward |
| 9,229,328 B2 | 1/2016 | Khurana et al. |
| 9,233,840 B2* | 1/2016 | Cheng ............... B81C 1/00031 |
| 9,276,059 B2 | 3/2016 | Millward et al. |
| 9,312,220 B2* | 4/2016 | Lu ..................... H01L 23/5222 |
| 10,153,200 B2 | 12/2018 | Millward et al. |
| 2001/0024768 A1* | 9/2001 | Matsuo ............... G03F 7/0045 |
| | | 438/328 |
| 2001/0049195 A1 | 12/2001 | Chooi et al. |
| 2002/0055239 A1 | 5/2002 | Tuominen et al. |
| 2002/0084429 A1 | 7/2002 | Craighead et al. |
| 2002/0158342 A1 | 10/2002 | Tuominen et al. |
| 2002/0158432 A1 | 10/2002 | Wain |
| 2002/0167117 A1 | 11/2002 | Chou |
| 2003/0010241 A1 | 1/2003 | Fujihira et al. |
| 2003/0034329 A1 | 2/2003 | Chou |
| 2003/0068639 A1 | 4/2003 | Haneder et al. |
| 2003/0077452 A1 | 4/2003 | Guire et al. |
| 2003/0080471 A1 | 5/2003 | Chou |
| 2003/0080472 A1 | 5/2003 | Chou |
| 2003/0091752 A1 | 5/2003 | Nealey et al. |
| 2003/0100822 A1 | 5/2003 | Lew et al. |
| 2003/0108879 A1 | 6/2003 | Klaerner et al. |
| 2003/0143375 A1 | 7/2003 | Noguchi et al. |
| 2003/0157248 A1 | 8/2003 | Watkins et al. |
| 2003/0178707 A1 | 9/2003 | Abbott |
| 2003/0180522 A1 | 9/2003 | Desimone et al. |
| 2003/0180966 A1 | 9/2003 | Abbott et al. |
| 2003/0185741 A1 | 10/2003 | Matyjaszewski et al. |
| 2003/0196748 A1 | 10/2003 | Hougham et al. |
| 2003/0218644 A1 | 11/2003 | Higuchi et al. |
| 2003/0222048 A1 | 12/2003 | Asakawa et al. |
| 2003/0235930 A1 | 12/2003 | Bao et al. |
| 2004/0023287 A1 | 2/2004 | Harnack et al. |
| 2004/0028875 A1 | 2/2004 | Van et al. |
| 2004/0058059 A1 | 3/2004 | Linford et al. |
| 2004/0076757 A1 | 4/2004 | Jacobson et al. |
| 2004/0084298 A1 | 5/2004 | Yao et al. |
| 2004/0109263 A1 | 6/2004 | Suda et al. |
| 2004/0124092 A1 | 7/2004 | Black et al. |
| 2004/0125266 A1 | 7/2004 | Miyauchi et al. |
| 2004/0127001 A1 | 7/2004 | Colburn et al. |
| 2004/0142578 A1 | 7/2004 | Wiesner et al. |
| 2004/0159633 A1 | 8/2004 | Whitesides et al. |
| 2004/0163758 A1 | 8/2004 | Kagan et al. |
| 2004/0175628 A1 | 9/2004 | Nealey et al. |
| 2004/0192013 A1 | 9/2004 | Ryu et al. |
| 2004/0222415 A1 | 11/2004 | Chou et al. |
| 2004/0242688 A1 | 12/2004 | Chandross et al. |
| 2004/0254317 A1 | 12/2004 | Hu et al. |
| 2004/0256615 A1 | 12/2004 | Sirringhaus et al. |
| 2004/0256662 A1 | 12/2004 | Black et al. |
| 2004/0265548 A1 | 12/2004 | Ho et al. |
| 2005/0008828 A1 | 1/2005 | Libera et al. |
| 2005/0062165 A1 | 3/2005 | Saenger et al. |
| 2005/0074706 A1 | 4/2005 | Bristol et al. |
| 2005/0079486 A1 | 4/2005 | Abbott et al. |
| 2005/0100830 A1 | 5/2005 | Xu et al. |
| 2005/0120902 A1 | 6/2005 | Adams et al. |
| 2005/0124135 A1 | 6/2005 | Ayazi et al. |
| 2005/0133697 A1 | 6/2005 | Potyrailo et al. |
| 2005/0147841 A1 | 7/2005 | Tavkhelidze et al. |
| 2005/0159293 A1 | 7/2005 | Wan et al. |
| 2005/0167651 A1 | 8/2005 | Merkulov et al. |
| 2005/0176256 A1 | 8/2005 | Kudelka |
| 2005/0208752 A1 | 9/2005 | Colburn et al. |
| 2005/0238889 A1 | 10/2005 | Iwamoto et al. |
| 2005/0238967 A1 | 10/2005 | Rogers et al. |
| 2005/0250053 A1 | 11/2005 | Marsh et al. |
| 2005/0271805 A1 | 12/2005 | Kambe et al. |
| 2005/0272341 A1 | 12/2005 | Colburn et al. |
| 2006/0013956 A1 | 1/2006 | Angelescu et al. |
| 2006/0014001 A1 | 1/2006 | Zhang et al. |
| 2006/0014083 A1 | 1/2006 | Carlson |
| 2006/0024590 A1 | 2/2006 | Sandhu |
| 2006/0030495 A1 | 2/2006 | Gregg |
| 2006/0035387 A1 | 2/2006 | Wagner et al. |
| 2006/0038182 A1 | 2/2006 | Rogers et al. |
| 2006/0046079 A1 | 3/2006 | Lee et al. |
| 2006/0046480 A1 | 3/2006 | Guo |
| 2006/0046484 A1 | 3/2006 | Abatchev et al. |
| 2006/0060863 A1 | 3/2006 | Lu et al. |
| 2006/0062867 A1 | 3/2006 | Choi et al. |
| 2006/0078681 A1 | 4/2006 | Hieda et al. |
| 2006/0097134 A1 | 5/2006 | Rhodes |
| 2006/0105562 A1 | 5/2006 | Yi |
| 2006/0124467 A1 | 6/2006 | Ho et al. |
| 2006/0128165 A1 | 6/2006 | Theiss et al. |

(56) References Cited

U.S. PATENT DOCUMENTS

| | | |
|---|---|---|
| 2006/0134556 A1 | 6/2006 | Nealey et al. |
| 2006/0137554 A1 | 6/2006 | Kron et al. |
| 2006/0141222 A1 | 6/2006 | Fischer et al. |
| 2006/0141245 A1 | 6/2006 | Stellacci et al. |
| 2006/0154466 A1 | 7/2006 | Lee et al. |
| 2006/0163646 A1 | 7/2006 | Black et al. |
| 2006/0192283 A1 | 8/2006 | Benson |
| 2006/0205875 A1 | 9/2006 | Cha et al. |
| 2006/0211871 A1 | 9/2006 | Dai et al. |
| 2006/0217285 A1 | 9/2006 | Destarac |
| 2006/0228635 A1 | 10/2006 | Suleski |
| 2006/0231525 A1 | 10/2006 | Asakawa et al. |
| 2006/0249784 A1 | 11/2006 | Black et al. |
| 2006/0249796 A1 | 11/2006 | Tavkhelidze et al. |
| 2006/0254440 A1 | 11/2006 | Choi et al. |
| 2006/0255505 A1 | 11/2006 | Sandhu et al. |
| 2006/0257633 A1 | 11/2006 | Inoue et al. |
| 2006/0258159 A1 | 11/2006 | Colburn et al. |
| 2006/0278158 A1 | 12/2006 | Tolbert et al. |
| 2006/0281266 A1 | 12/2006 | Wells |
| 2006/0286305 A1 | 12/2006 | Thies et al. |
| 2006/0286490 A1 | 12/2006 | Sandhu et al. |
| 2006/0292777 A1 | 12/2006 | Dunbar |
| 2007/0020749 A1 | 1/2007 | Nealey et al. |
| 2007/0023247 A1 | 2/2007 | Ulicny et al. |
| 2007/0023805 A1 | 2/2007 | Wells et al. |
| 2007/0045562 A1 | 3/2007 | Parekh |
| 2007/0045642 A1 | 3/2007 | Li |
| 2007/0071881 A1 | 3/2007 | Chua et al. |
| 2007/0072403 A1 | 3/2007 | Sakata |
| 2007/0122749 A1 | 5/2007 | Fu et al. |
| 2007/0122932 A1 | 5/2007 | Kodas et al. |
| 2007/0138131 A1 | 6/2007 | Burdinski |
| 2007/0161237 A1 | 7/2007 | Lieber et al. |
| 2007/0175859 A1 | 8/2007 | Black et al. |
| 2007/0181870 A1 | 8/2007 | Libertino et al. |
| 2007/0183035 A1 | 8/2007 | Asakawa et al. |
| 2007/0194403 A1 | 8/2007 | Cannon et al. |
| 2007/0200477 A1 | 8/2007 | Tuominen et al. |
| 2007/0208159 A1 | 9/2007 | McCloskey et al. |
| 2007/0218202 A1 | 9/2007 | Ajayan et al. |
| 2007/0222995 A1 | 9/2007 | Lu |
| 2007/0224819 A1 | 9/2007 | Sandhu |
| 2007/0224823 A1 | 9/2007 | Sandhu |
| 2007/0227383 A1 | 10/2007 | Decre et al. |
| 2007/0249117 A1 | 10/2007 | Kang et al. |
| 2007/0272951 A1 | 11/2007 | Lieber et al. |
| 2007/0281220 A1 | 12/2007 | Sandhu et al. |
| 2007/0289943 A1 | 12/2007 | Lu et al. |
| 2007/0293041 A1 | 12/2007 | Yang et al. |
| 2008/0032238 A1 | 2/2008 | Lu et al. |
| 2008/0038467 A1 | 2/2008 | Jagannathan et al. |
| 2008/0038923 A1 | 2/2008 | Edelstein et al. |
| 2008/0041818 A1 | 2/2008 | Kihara et al. |
| 2008/0047930 A1 | 2/2008 | Blanchet et al. |
| 2008/0064217 A1 | 3/2008 | Horii |
| 2008/0073743 A1 | 3/2008 | Alizadeh et al. |
| 2008/0078982 A1 | 4/2008 | Min et al. |
| 2008/0078999 A1 | 4/2008 | Lai |
| 2008/0083991 A1 | 4/2008 | Yang et al. |
| 2008/0085601 A1 | 4/2008 | Park et al. |
| 2008/0093743 A1 | 4/2008 | Yang et al. |
| 2008/0102252 A1 | 5/2008 | Black et al. |
| 2008/0103256 A1 | 5/2008 | Kim et al. |
| 2008/0113169 A1 | 5/2008 | Cha et al. |
| 2008/0164558 A1 | 7/2008 | Yang et al. |
| 2008/0174726 A1 | 7/2008 | Kim |
| 2008/0176767 A1 | 7/2008 | Millward |
| 2008/0191200 A1 | 8/2008 | Frisbie et al. |
| 2008/0193658 A1* | 8/2008 | Millward ............... C23F 1/02 427/401 |
| 2008/0217292 A1 | 9/2008 | Millward et al. |
| 2008/0233297 A1 | 9/2008 | De et al. |
| 2008/0233323 A1 | 9/2008 | Cheng et al. |
| 2008/0241218 A1 | 10/2008 | McMorrow et al. |
| 2008/0257187 A1 | 10/2008 | Millward |
| 2008/0260941 A1 | 10/2008 | Jin |
| 2008/0274413 A1 | 11/2008 | Millward |
| 2008/0286659 A1 | 11/2008 | Millward |
| 2008/0311347 A1 | 12/2008 | Millward et al. |
| 2008/0315270 A1 | 12/2008 | Marsh et al. |
| 2008/0318005 A1 | 12/2008 | Millward |
| 2009/0020924 A1 | 1/2009 | Lin |
| 2009/0062470 A1 | 3/2009 | Millward et al. |
| 2009/0087664 A1 | 4/2009 | Nealey et al. |
| 2009/0148795 A1 | 6/2009 | Li et al. |
| 2009/0155579 A1 | 6/2009 | Greco et al. |
| 2009/0173920 A1 | 7/2009 | Kang et al. |
| 2009/0196488 A1 | 8/2009 | Nealey et al. |
| 2009/0200646 A1 | 8/2009 | Millward et al. |
| 2009/0206489 A1 | 8/2009 | Li et al. |
| 2009/0212016 A1 | 8/2009 | Cheng et al. |
| 2009/0218567 A1 | 9/2009 | Mathew et al. |
| 2009/0236309 A1 | 9/2009 | Millward et al. |
| 2009/0240001 A1 | 9/2009 | Regner |
| 2009/0263628 A1 | 10/2009 | Millward |
| 2009/0267058 A1 | 10/2009 | Namdas et al. |
| 2009/0274887 A1 | 11/2009 | Millward et al. |
| 2009/0317540 A1 | 12/2009 | Sandhu et al. |
| 2010/0092873 A1 | 4/2010 | Sills et al. |
| 2010/0102415 A1 | 4/2010 | Millward et al. |
| 2010/0124826 A1 | 5/2010 | Millward et al. |
| 2010/0137496 A1 | 6/2010 | Millward et al. |
| 2010/0150510 A1 | 6/2010 | Sato et al. |
| 2010/0163180 A1 | 7/2010 | Millward |
| 2010/0204402 A1 | 8/2010 | Millward et al. |
| 2010/0279062 A1 | 11/2010 | Millward et al. |
| 2010/0316849 A1 | 12/2010 | Millward et al. |
| 2010/0323096 A1 | 12/2010 | Sills et al. |
| 2011/0232515 A1 | 9/2011 | Millward |
| 2011/0250745 A1 | 10/2011 | Millward et al. |
| 2012/0028471 A1 | 2/2012 | Oyama et al. |
| 2012/0076978 A1 | 3/2012 | Millward et al. |
| 2012/0122292 A1 | 5/2012 | Sandhu et al. |
| 2012/0133017 A1 | 5/2012 | Millward et al. |
| 2012/0135146 A1 | 5/2012 | Cheng et al. |
| 2012/0135159 A1 | 5/2012 | Xiao et al. |
| 2012/0138570 A1 | 6/2012 | Millward et al. |
| 2012/0141741 A1 | 6/2012 | Millward |
| 2012/0164389 A1 | 6/2012 | Yang et al. |
| 2012/0202017 A1* | 8/2012 | Nealey ............... B82Y 30/00 427/256 |
| 2012/0211871 A1 | 8/2012 | Russell et al. |
| 2012/0223051 A1 | 9/2012 | Millward |
| 2012/0223052 A1 | 9/2012 | Regner |
| 2012/0223053 A1 | 9/2012 | Millward et al. |
| 2012/0225243 A1 | 9/2012 | Millward |
| 2013/0105755 A1 | 5/2013 | Sills et al. |
| 2013/0189492 A1 | 7/2013 | Millward et al. |
| 2013/0285214 A1 | 10/2013 | Millward et al. |
| 2013/0295323 A1 | 11/2013 | Millward |
| 2013/0330668 A1 | 12/2013 | Wu et al. |
| 2013/0330688 A1 | 12/2013 | Hedrick et al. |
| 2014/0060736 A1 | 3/2014 | Millward et al. |
| 2014/0072722 A1* | 3/2014 | Kawanishi ............ G03F 7/0002 427/532 |
| 2014/0087566 A1* | 3/2014 | Kato ................... H01L 21/0337 438/761 |
| 2014/0091435 A1* | 4/2014 | Chan ................... H01L 21/0271 257/618 |
| 2014/0097520 A1 | 4/2014 | Millward |
| 2014/0127626 A1 | 5/2014 | Senzaki et al. |
| 2014/0131839 A1* | 5/2014 | Chan ..................... B82Y 40/00 257/618 |
| 2014/0252660 A1* | 9/2014 | Farrell ................ H01L 21/3086 438/701 |
| 2014/0272723 A1 | 9/2014 | Somervell et al. |
| 2015/0021293 A1 | 1/2015 | Morris et al. |
| 2015/0091137 A1 | 4/2015 | Hendricks et al. |

(56) References Cited

U.S. PATENT DOCUMENTS

| | | | |
|---|---|---|---|
| 2015/0122303 A1* | 5/2015 | Kato | H10N 10/17 438/54 |
| 2015/0191034 A1 | 7/2015 | Millward et al. | |
| 2016/0204002 A1* | 7/2016 | Wallace | H01L 23/49894 257/773 |

FOREIGN PATENT DOCUMENTS

| | | |
|---|---|---|
| CN | 101013662 A | 8/2007 |
| EP | 0784543 A1 | 7/1997 |
| EP | 1416303 A2 | 5/2004 |
| EP | 1906237 A2 | 4/2008 |
| EP | 1593164 B1 | 6/2010 |
| JP | 11-080414 A | 3/1999 |
| JP | 2003-155365 A | 5/2003 |
| JP | 2004-335962 A | 11/2004 |
| JP | 2005-008882 A | 1/2005 |
| JP | 2005-029779 A | 2/2005 |
| JP | 2006-036923 A | 2/2006 |
| JP | 2006-055982 A | 3/2006 |
| JP | 2006-110434 A | 4/2006 |
| JP | 2007-194175 A | 8/2007 |
| JP | 2008-036491 A | 2/2008 |
| JP | 2008-043873 A | 2/2008 |
| KR | 10-2006-0128378 A | 12/2006 |
| KR | 10-2007-0029762 A | 3/2007 |
| KR | 10-0771886 B1 | 11/2007 |
| TW | 200400990 A | 1/2004 |
| TW | 584670 B | 4/2004 |
| TW | 200419017 A | 10/2004 |
| TW | 200511364 A | 3/2005 |
| TW | I253456 B | 4/2006 |
| TW | I256110 | 6/2006 |
| TW | 200633925 A | 10/2006 |
| TW | 200740602 A | 11/2007 |
| TW | 200802421 A | 1/2008 |
| WO | 90/07575 A1 | 7/1990 |
| WO | 97/06013 A1 | 2/1997 |
| WO | 98/39645 A1 | 9/1998 |
| WO | 99/47570 A1 | 9/1999 |
| WO | 00/02090 A2 | 1/2000 |
| WO | 00/31183 A1 | 6/2000 |
| WO | 02/18080 A1 | 3/2002 |
| WO | 02/81372 A2 | 10/2002 |
| WO | 03/45840 A2 | 6/2003 |
| WO | 2005/122285 A2 | 12/2005 |
| WO | 2006/003592 A2 | 1/2006 |
| WO | 2006/003594 A2 | 1/2006 |
| WO | 2006/076016 A2 | 7/2006 |
| WO | 2006/078952 A1 | 7/2006 |
| WO | 2006/112887 A2 | 10/2006 |
| WO | 2007/001294 A1 | 1/2007 |
| WO | 2007/013889 A2 | 2/2007 |
| WO | 2007/024241 A2 | 3/2007 |
| WO | 2007/024323 A2 | 3/2007 |
| WO | 2007/019439 A3 | 5/2007 |
| WO | 2007/055041 A1 | 5/2007 |
| WO | 2008/055137 A2 | 5/2008 |
| WO | 2008/091741 A2 | 7/2008 |
| WO | 2008/096335 A2 | 8/2008 |
| WO | 2008/097736 A2 | 8/2008 |
| WO | 2008/118635 A2 | 10/2008 |
| WO | 2008/124219 A2 | 10/2008 |
| WO | 2008/130847 A1 | 10/2008 |
| WO | 2008/145268 A1 | 12/2008 |
| WO | 2008/156977 A2 | 12/2008 |
| WO | 2009/099924 A2 | 8/2009 |
| WO | 2009/102551 A2 | 8/2009 |
| WO | 2009/117238 A2 | 9/2009 |
| WO | 2009/117243 A1 | 9/2009 |
| WO | 2009/134635 A2 | 11/2009 |

OTHER PUBLICATIONS

Fujita et al., Thin Silica Film with a Network Structure as Prepared by Surface Sol-Gel Transcription on the Poly (styrene-b-4-vinylpyridine) Polymer Film, Chemistry Letters, vol. 32, No. 4, (Mar. 13, 2003), pp. 352-353.

Fukunaga et al. "Self-Assembly of Block Copolymer Thin Films Having a Half-Domain-Spacing Thickness: Nonequilibrium Pathways to Achieve Equilibrium Brush Layers Parallel to Substrate," Macromolecules vol. 39, Aug. 2006; p. 6171-6179.

Gates et al., Unconventional Nanofabrication, Annu. Rev. Maler. Res., vol. 34, (2004), pp. 339-372.

Gates, "Nanofabrication with Molds and Stamps," Materials Today, pp. 44-49, (Feb. 2005).

Ge et al., Thermal Conductance of Hydrophilic and Hydrophobic Interfaces, The American Physical Society, PRL 96, (May 12, 2006), pp. 186101-1-186101-4.

Gelest, Inc., Silane Coupling Agents: Connecting Across Boundaries, v2.0, (2006), pp. 1-56.

Genua et al., Functional Patterns Obtained by Nanoimprinting Lithography and Subsequent Growth of Polymer Brushes, Nanotechnology, vol. 18, (2007), pp. 1-7.

Gillmor et al., Hydrophilic/Hydrophobic Patterned Surfaces as Templates for DNA Arrays, Langmuir 2000, vol. 16, No. 18, (2000), pp. 7223-7228.

Grubbs, Hybrid Metal-Polymer Composites from Functional Block Copolymers, J. of Polymer Sci.: Part A: Polymer Chemistry, vol. 43, Issue 19, (Oct. 1, 2005), pp. 4323-4336.

Guarini et al., Nanoscale Patterning Using Self-Assembled Polymers for Semiconductor Applications, J. Vac. Sci. Technol. B 19(6), (Nov./Dec. 2001), pp. 2784-2788.

Gudipati et al., Hyperbranched Fluoropolymer and Linear Poly(ethylene glycol) Based Amphiphilic Crosslinked Networks as Efficient Anlifouling Coatings: An Insight into the Surface Compositions, Topographies, and Morphologies, Journal of Polymer Science: Part A: Polymer Chemistry, vol. 42, (2004), pp. 6193-6208.

Guo et al., Synthesis and Characterization of Novel Biodegradable Unsaturated Poly(ester amide)/Poly(ethylene glycol) Diacrylate Hydrogels, Journal of Polymer Science Part A: Polymer Chemistry, vol. 43, Issue 17, (2005), pp. 3932-3944 (Abstract only).

Hadziioannou, Semiconducting Block Copolymers for Self-Assembled Photovoltaic Devices, MRS Bulletin, (Jun. 2002), pp. 456-460.

Hamers, Passivation and Activation: How Do Monovalent Atoms Modify the Reactivity of Silicon Surfaces? A Perspective on the Article, "The Mechanism of Amine Formation on Si( 100) Activated with Chlorine Atoms", by C.C. Finstad, A.D. Thorsness, and A.J. Muscat, Surface Sci., vol. 600, (2006), pp. 3361-3362.

Hamley, I. W., Introduction to Block Copolymers, Developments in Block Copolymers Science and Technology, John Wiley & Sons, Lid., (2004), pp. 29.

Hammond et al. "Temperature Dependence of Order, Disorder, and Defects in Laterally Confined Diblock Copolymer Cylinder Monolayers," Macromoleculers vol. 38, Jul. 2005; p. 6575-6585.

Harrison et al., Layer by Layer Imaging of Diblock Copolymer Films with a Scanning Electron Microscope, Polymer, vol. 39, No. 13, (1998), p. 273 2744.

Hawker et al., Facile Synthesis of Block Copolymers for Nanolithographic Applications, Polymer Preprints, American Chemical Society, vol. 46, No. 2, (2005), pp. 239-240.

Hawker et al., Improving the Manufacturability and Structural Control of Block Copolymer Lithography, Abstracts o Papers, 232nd ACS National Meeting, San Francisco, CA, (Sep. 10-14, 2006), 1 page, (Abstract only).

Hayward et al., Crosslinked Poly(styrene)-block-Poly(2-vinylpyridine) Thin Films as Swellable Templates for Mesostructured Silica and Titania, Advanced Materials, vol. 17, (2005), pp. 259 2595.

He et al., Self-Assembly of Block Copolymer Micelles in an Ionic Liquid, J. Am. Chem. Soc., vol. 128, (2006), pp. 2745-2750.

Helmbold et al., Optical Absorption of Amorphous Hydrogenated Carbon Thin Films, Thin Solid Films, vol. 283, (1996), pp. 196-203.

Helmuth et al., High-Speed Microcontact Printing, J_ Am. Chem. Soc., vol. 128, No. 29, (2006), pp. 9296-9297.

(56) References Cited

OTHER PUBLICATIONS

Hermans et al., Application of Solvent-Directed Assembly of Block Copolymers to the Synthesis of Nanostructured Materials with Low Dielectric Constants, Angewandte Chem. Int'l. Ed., vol. 45, Issue 40, (Oct. 13, 2006), pp. 5648-6652.

Horiuchi et al., Three-Dimensional Nanoscale Alignment of Metal Nanoparticles Using Block Copolymer Films as Nanoreactors, Langmuir, vol. 19, (2003), pp. 2963-2973.

Huang et al., "Stretchable gold conductors on elastomeric substrates," Applied Physics Letters, vol. 82, No. 15, Apr. 14, 2003, pp. 2404-2406.

Huang et al., "Using Surface Active Random Copolymers to Control the Domain Orientation in Diblock Copolymer Thin Films," Macromolecules, 1998, 31, 7641-7650.

Hur et al., Nanotransfer Printing by Use of Noncovalent Surface Forces: Applications to Thin-Film Transistors That Use Single-Walled Carbon Nanotube Networks and Semiconducting Polymers, Applied Physics Letters, vol. 85, No. 23, (Dec. 6, 2004), pp. 573 5732.

Hutchison et al., Polymerizable Living Free Radical Initiators as a Platform to Synthesize Functional Networks, Chem. Maler., vol. 17, No. 19, (2005), pp. 478+4797.

Ikeda et al., Control of Orientation of Thin Films of Organic Semiconductors by Graphoepitaxy, Nanolech Japan Bulletin—NIMS International Center for Nanotechnology Network., vol. 3, No. 3, (Dec. 17, 2010), 23 pages.

In et al., Side-Chain-Grafted Random Copolymer Brushes as Neutral Surfaces for Controlling the Orientation of Block Copolymer Microdomains in Thin Films, Langmuir, vol. 22, No. 18, (2006), pp. 7855-7860.

Ji et al., Generalization of the Use of Random Copolymers to Control the Wetting Behaviors of Block Copolymer Films, Macromolecules, vol. 41, No. 23, (2008), pp. 9098-9103.

Ji et al., Molecular Transfer Printing Using Block Copolymers, ACS Nano, vol. 4, No. 2, (2010), pp. 599-609.

Ji et al., Preparation of Neutral Wetting Brushes for Block Copolymer Films from Homopolymer Blends, submitted to Advanced Materials, vol. 20, No. 16, (Jul. 7, 2008), pp. 3054-3060.

Jiang et al., Electrochemical Desorption of Self-Assembled Monolayers Noninvasively Releases Patterned Cells from Geometrical Confinements, J. Am. Chem. Soc., vol. 125, No. 9, (2003), pp. 2366-2367.

Johnson et al., Probing the Stability of the Disulfide Radical Intermediate of Thioredoxin Using Direct Electrochemistry, Letters in Peptide Sci., vol. 10, (2003), pp. 495-500.

Jun et al., Microcontact Printing Directly on the Silicon Surface, Langmuir, vol. 18, No. 9, (2002), pp. 3415-3417, (Abstract only).

Jun et al., Patterning Protein Molecules on Poly(ethylene glycol) Coaled Si(111), Biomaterials, vol. 25, (2004), pp. 3503-3509.

Karim et al., Control of Ordering Kinetics and Morphology Using Zone Annealing of Thin Block Copolymer Films, Abstract submitted for the Mar. 2007 Meeting of The American Physical Society, (Nov. 20, 2006), 2 pages.

Kavakli et al., Single and Double-Layer Antireflection Coatings on Silicon, Turk J. Phys., vol. 26, (2002), pp. 349-354.

Kim et al., Epitaxial Self-Assembly of Block Copolymers on Lithographically Defined Nanopatterned Substrates, Nature, vol. 424, (Jul. 24, 2003), pp. 411-414.

Kim et al., Highly Oriented and Ordered Arrays from Block Copolymers via Solvent Evaporation, Adv. Maler., vol. 16, No. 3, (Feb. 3, 2004), pp. 226-231.

Kim et al., Hybrid Nanofabrication Processes Utilizing Diblock Copolymer Nanotemplate Prepared by Self-Assembled Monolayer Based Surface Neutralization, J_ Vac. Sci. Technol. B, vol. 26, No. 1, (Jan./Feb. 2008), pp. 189-194.

Kim et al., In Vitro Release Behavior of Dextran-melhacrylale Hydrogels Using Doxorubicin and other Model Compounds, J. Biomaler. Appl., vol. 15, No. 1, (Jul. 2000), pp. 23-46, (Abstract only).

Kim et al., Novel Complex Nanostructure from Directed Assembly of Block Copolymers on Incommensurate Surface Patterns, Adv. Maler, vol. 19, (2007), pp. 3271-3275.

Kim et al., Salt Complexation in Block Copolymer Thin Films, Macromolecules, vol. 39, No. 24, (2006), pp. 8473-8479.

Kim et al., Self-assembled Hydrogel Nanoparticles Composed of Dextran and Poly (ethylene glycol) Macromer, Int J Pharm., vol. 205, No. 1-2, (Sep. 15, 2000), pp. 109-116, abstract only.

Kim et al., Solvent-Induced Ordering in Thin Film Diblock Copolymer/Homopolymer Mixtures, Advanced Maler., vol. 16, No. 2 24, (Dec. 17, 2004), pp. 2119-2123.

Kim et al., Synthesis and characterization of Dextran-melhacrylale Hydrogels and Structural Study by SEM, J Biomaler Res., vol. 49, No. 4, (Mar. 15, 2000), pp. 517-527, abstract only.

Knoll et al., Phase Behavior in Thin Films of Cylinder-Forming Block Copolymers, Physical Review Letters, vol. 89, No. 3, (Jul. 15, 2002), pp. 035501-1-035501-4.

Krishnamoorthy et al., Block Copolymer Micelles as Switchable Templates for Nanofabricalion, Langmuir, vol. 22, No. 8, (2006), pp. 3450-3452.

Krishnamoorthy et al., Nanopatterned Self-Assembled Monolayers by Using Diblock Copolymer Micelles as Nanometer-Scale Adsorption and Etch Masks, Advanced Materials, (2008), pp. 1-4.

Krishnamoorthy et al., Nanoscale Patterning with Block Copolymers, Materials Today, vol. 9, No. 9, (Sep. 2006), pp. 40-47.

Kuhnline et al., "Detecting thiols in a microchip device using micromolded carbon ink electrodes modified with cobalt phthalocyanine", Analyst, vol. 131, pp. 202-207, (2006).

La et al., Directed Assembly of Cylinder-Forming Block Copolymers into Patterned Structures to Fabricate Arrays of Spherical Domains and Nanoparticles, Chem. Maler., vol. 19, No. 18, (2007), pp. 4538-4544.

La et al., Pixelated Chemically Amplified Resists: Investigation of Material Structure on the Spatial Distribution of Photoacids and Line Edge Roughness, J_ Vac. Sci. Technol. B, vol. 25, No. 6, (Nov./Dec. 2007), pp. 2508-2513.

Laracuente et al., Step Structure and Surface Morphology of Hydrogen-terminated Silicon: (001) to (114), Surface Science 545, (2003), pp. 70-84.

Lentz et al., Whole Wafer Imprint Patterning Using Step and Flash Imprint Lithography: A Manufacturing Solution for Sub 100 nm Patterning, SPIE Emerging Lithographic Technologies, vol. 6517, (Mar. 16, 2007), 10 pages.

Li et al., A Method for Patterning Multiple Types of Cells by Using Electrochemical Desorption of Self-Assembled Monolayers within Microfluidic Channels, Angew. Chem. Int. Ed., vol. 46, (2007), pp. 1094-1096.

Li et al., Block Copolymer Patterns and Templates, Materials Today, vol. 9, No. 9, (Sep. 2006), pp. 30-39.

Li et al., Creation of Sub-20-nm Contact Using Diblock Copolymer on a 300 mm Wafer for Complementary Metal Oxide Semiconductor Applications, J_ Vac. Sci. Technol. B, vol. 25, No. 6, (Nov./Dec. 2007), pp. 1982-1984.

Li et al., Morphology Change of Asymmetric Diblock Copolymer Micellar Films During Solvent Annealing, ScienceDirect, Polymer 48, (2007), pp. 2434-2443.

Li et al., Ordered Block-Copolymer Assembly Using Nanoimprinl Lithography, Nano Lett. (2004), vol. 4, No. 9, pp. 1633-1636.

Lin et al., A Rapid Route to Arrays of Nanostructures in Thin Films, Adv. Maler., vol. 14, No. 19, (Oct. 2, 2002), pp. 1373-1376.

Lin-Gibson et al., Structure-Property Relationships of Pholopolymerizable Poly(elhylene glycol) Dimelhacrylale Hydrogels, Macromolecules, vol. 38, (2005), pp. 2897-2902.

Liu et al., Pattern Transfer Using Poly(slyrene-block-methyl melhacrylale) Copolymer Films and Reactive Ion Etching, J. Vac. Sci. Technol. B, vol. 25, No. 6, (Nov./Dec. 2007), pp. 1963-1968.

Loo et al., Additive, Nanoscale Patterning of Metal Films with a Stamp and a Surface Chemistry Mediated Transfer Process: Applications in Plastic Electronics, Applied Physics Letters, vol. 81, No. 3, (Jul. 15, 2002), pp. 562-564.

Lopes et al., Hierarchical Self-Assembly of Metal Nanostructures on Diblock Copolymer Scaffolds, Nature, vol. 41, (Dec. 13, 2001), pp. 735-738.

(56) References Cited

OTHER PUBLICATIONS

Lutolf et al., Cell-Responsive Synthetic Hydrogels, Adv. Maler., vol. 15, No. 11, (Jun. 2003), pp. 888-892.
Lutolf et al., Synthetic Biomalerials as Instructive Extracellular Microenvironmenls for Morphogenesis in Tissue Engineering, Nature Biotechnology, vol. 23, (2005), pp. 47-55, (Abstract only).
Lutz, 1,3-Dipolar Cycloaddilions of Azides and Alkynes: A Universal Ligation Tool in Polymer and Materials Science, Angew. Chem. Int. Ed., vol. 46, (2007), pp. 1018-1025.
Malenfant et al., Self-Assembly of an Organic-Inorganic Block Copolymer for Nano-Ordered Ceramics, Nature Nanotechnology, vol. 2, (Jan. 2007) pp. 43-46.
Malkoch et al., Synthesis of Well-Defined Hydrogel Networks Using Click Chemistry, Chem. Commun., (2006), pp. 2774-2776.
Mansky et al., Controlling Polymer-Surface Interactions with Random Copolymer Brushes, Science, vol. 275, (Mar. 7, 1997), pp. 1458-1460.
Martens et al., Characterization of Hydrogels Formed from Acrylate Modified Poly(vinyl alcohol) Macromers, Polymer, vol. 41, Issue 21, (Oct. 2000), pp. 7715-7722, abstract only.
Matsuda et al., Photoinduced Prevention of Tissue Adhesion, ASAIO J, vol. 38, No. 3, (Jul.-Sep. 1992), pp. M154-M157, (Abstract only).
Maye et al., Chemical Analysis Using Force Microscopy, Journal of Chemical Education, vol. 79, No. 2, (Feb. 2002), pp. 207-210.
Melde et al., Silica Nanostructures Templated by Oriented Block Copolymer Thin Films Using Pore-Filling and Selective-Mineralization Routes, Chem. Maler., vol. 17, No. 18, (Aug. 13, 2005), pp. 4743-4749.
Metters et al., Network Formation and Degradation Behavior of Hydrogels Formed by Michael-Type Addition Reactions, Biomacromolecules 2005, vol. 6, (2005), pp. 290-301.
Meyer et al., Controlled Dewetting Processes on Microstructured Surfaces—a New Procedure for Thin Film Microstructuring, Macromolecular Maler. Eng., vol. 276/277, (2000), pp. 44-50.
Mezzenga et al., On the Role of Block Copolymers in Self-Assembly of Dense Colloidal Polymeric Systems, Langmuir 2003, vol. 19, No. 20, (2003), pp. 8144-8147.
Mindel et al., A Study of Bredig Platinum Sols, The Chemical Laboratories of New York University, vol. 65, (Jun. 10, 1943), p. 2112.
Naito et al., 2.5-Inch Disk Patterned Media Prepared by an Artificially Assisted Self-Assembling Method, IEEE Transactions on Magnetics, vol. 38, No. 5, (Sep. 2002), pp. 1949-1951.
Nealey et al., Self-Assembling Resists for Nanolithography, IProceedings of the IEEE International Electron Devices Meeting, IEDM Technical Digest, (2005), pp. 356-359.
Nguyen et al., Photopolymerizable Hydrogels for Tissue Engineering Applications, Biomaterials, vol. 23, (2002), pp. 4307-4314.
Nishikubo, T., Chemical Modification of Polymers via a Phase-Transfer Catalyst or Organic Strong Base, American Chemical Society Symposium Series, (1997), pp. 214-230.
Niu et al., Selective Assembly of Nanoparticles on Block Copolymer by Surface Modification, Nanotechnology, vol. 18, (2007), pp. 1-4.
Niu et al., Stability of Order in Solvent-Annealed Block Copolymer Thin Films, Macromolecules, vol. 36, No. 7, (2003), pp. 2428-2440, (Abstract and Figures only).
Olayo-Valles et al., Large Area Nanolithographic Templates by Selective Etching of Chemically Stained Block Copolymer Thin Films, J. Mater. Chem., vol. 14, (2004), pp. 2729-2731.
Parejo et al., Highly Efficient UV-Absorbing Thin-Film Coatings for Protection of Organic Materials Against Pholodegradalion, J. Mater. Chem., vol. 16, (2006), pp. 2165-2169.
Park et al., Block Copolymer Lithography: Periodic Arrays of -10Holes in 1 Square Centimeter, Science, vol. 276, No. 5317, (May 30, 1997), pp. 1401-1404.
Park et al., Block Copolymer Multiple Patterning Integrated with Conventional ArF Lithography, Soft Matter, vol. 6, (2010), pp. 120-125.

Park et al., Controlled Ordering of Block Copolymer Thin Films by the Addition of Hydrophilic Nanoparticles, Macromolecules 2007, vol. 40, No. 22, (2007), pp. 8119-8124.
Park et al., Directed Assembly of Lamellae-Forming Block Copolymers by Using Chemically and Topographically Patterned Substrates, Advanced Materials, vol. 19, No. 4, (Feb. 2007), pp. 607-611.
Park et al., Enabling Nanotechnology with Self Assembled Block Copolymer Patterns, Polymer, vol. 44, No. 22, (2003), pp. 6725-6760.
Park et al., Fabrication of Highly Ordered Silicon Oxide Dots and Stripes from Block Copolymer Thin Films, Advanced Materials, vol. 20, (2008), pp. 681-685.
Park et al., High-Aspect-Ratio Cylindrical Nanopore Arrays and Their Use for Templating Titania Nanoposts, Advanced Materials, vol. 20, (2008), pp. 738-742.
Park et al., The Fabrication of Thin Films with Nanopores and Nanogrooves from Block Copolymer Thin Films on the Neutral Surface of Self-Assembled Monolayers, Nanotechnology, vol. 18, (2007), pp. 1-7.
Peng et al., Development of Nanodomain and Fractal Morphologies in Solvent Annealed Block Copolymer Thin Films, Macromol. Rapid Commun., vol. 28, (2007), pp. 1422-1428.
Peters et al., Combining Advanced Lithographic Techniques and Self-Assembly of Thin Films of Diblock Copolymers to Produce Templates for Nanofabrication, J_ Vac. Sci. Technol. B, vol. 18, No. 6, (Nov./Dec. 2000), pp. 3530-3532.
Peters et al., Morphology of Thin Films of Diblock Copolymers on Surfaces Micropattemed with Regions of Different Interfacial Energy, Macromolecules, vol. 35, No. 5, (2002), pp. 1822-1834.
Potemkin et al., Effect of the Molecular Weight of AB Diblock Copolymers on the Lamellar Orientation in Thin Films: Theory and Experiment, Macromol. Rapid Commun., (2007), 28, pp. 579-584.
Reed et al., Molecular Random Access Memory Cell, Appl. Phys. Lett., vol. 78, No. 23, (Jun. 4, 2001), pp. 3735-3737.
Resnick et al., Initial Study of the Fabrication of Step and Flash Imprint Lithography Templates for the Printing of Contact Holes, J. Micro/Nanolithography, MEMS, and MOEMS, vol. 3, No. 2, (Apr. 2004), pp. 316-321.
Rogers, J. A., Slice and Dice, Peel and Stick: Emerging Methods for Nanostructure Fabrication, ACS Nano, vol. 1, No. 3, (2007), pp. 151-153.
Rozkiewicz et al., "Click" Chemistry by Microcontact Printing, Angew. Chem. Int. Ed., vol. 45, No. 32, (Jul. 12, 2006), pp. 5292-5296.
Ruiz et al., Density Multiplication and Improved Lithography by Directed Block Copolymer Assembly, Science, vol. 321, (Aug. 15, 2008), pp. 936-939.
Ruiz et al., Induced Orientational Order in Symmetric Diblock Copolymer Thin-Films, Advanced Materials, vol. 19, No. 4, (2007), pp. 587-591.
Ryu et a., Surface Modification with Cross-Linked Random Copolymers: Minimum Effective Thickness, Macromolecules, vol. 40, No. 12, (2007), pp. 4296-4300.
Saraf et al., Spontaneous Planarization of Nanoscale Phase Separated Thin Film, Applied Physics Letters, vol. 80 No. 23, (Jun. 10, 2002), pp. 4425-4427.
Sato et al., Novel Antireflective Layer Using Polysilane for Deep Ultraviolet Lithography, J. Vac. Sci. Technol. B, vol. 17, No. 6, (Nov./Dec. 1999), pp. 3398-3401.
Sawhney et al., Bioerodible Hydrogels Based on Pholopolymerized Poly(elhylene glycol)-co-poly(a-hydroxy acid) Diacrylate Macromers, Macromolecules 1993, vol. 26, (1993), pp. 581-587, abstract only.
Segalman, R. A., Patterning with Block Copolymer Thin Films, Materials Science and Engineering R 48, (2005), pp. 191-226.
Shahrjerdi et al., Fabrication of Ni Nanocrystal Flash Memories Using a Polymeric Self-Assembly Approach, IEEE Electron Device Letters, vol. 28, No. 9, (Sep. 2007), pp. 793-796.
Sharma et al., Ultrathin Poly(ethylene glycol) Films for Silicon-based Microdevices, Applied Surface Science, vol. 206, (2003), pp. 218-229.

(56) References Cited

OTHER PUBLICATIONS

Sigma-Aldrich, Tutorial regarding Materials for Lithography/Nanopatterning, http://www.sigmaaldrich.com/Area.sub.--of.sub.--Inleresl/Chemistry/Maleri- als.sub .-Science/Micro.sub.-and.sub.--Nanoelectronic website, retrieved Aug. 27, 2007.
Sivaniah et al., Observation of Perpendicular Orientation in Symmetric Diblock Copolymer Thin Films on Rough Substrates, Macromolecules 2003, vol. 36, (2003), pp. 5894-5896.
Sivaniah et al., Symmetric Diblock Copolymer Thin Films on Rough Substrates, Kinetics and Structure Formation in Pure Block Copolymer Thin Films, Macromolecules 2005, vol. 38, (2005), pp. 1837-1849.
Sohn et al., Fabrication of the Multilayered Nanostructure of Alternating Polymers and Gold Nanoparticles with Thin Films of Self-Assembling Diblock Copolymers, Chem. Maler., vol. 13, (2001), pp. 1752-1757.
Solak, H. H., Nanolithography with Coherent Extreme Ultraviolet Light, Journal of Physics D: Applied Physics, vol. 39, (2006), pp. R171-R188.
Srinvivasan et al., Scanning Electron Microscopy of Nanoscale Chemical Patterns, ACS Nano, vol. 1, No. 3, (2007), pp. 191-201.
Stoykovich et al., Directed Assembly of Block Copolymer Blends into Nonregular Device-Oriented Structures, Science, vol. 308, (Jun. 3, 2005), pp. 1442-1446.
Stoykovich et al., Directed Self-Assembly of Block Copolymers for Nanolithography: Fabrication of Isolated Features and Essential Integrated Circuit Geometries, ACS Nano, vol. 1, No. 3, (2007), pp. 168-175.
Sundrani et al., Guiding Polymers to Perfection: Macroscopic Alignment of Nanoscale Domains, Nano Lett., vol. 4, No. 2, (2004), pp. 273-276.
Sundrani et al., Hierarchical Assembly and Compliance of Aligned Nanoscale Polymer Cylinders in Confinement, Langmuir 2004, vol. 20, No. 12, (2004), pp. 5091-5099.
Tadd et al, Spatial Distribution of Cobalt Nanoclusters in Block Copolymers, Langmuir, vol. 18, (2002), pp. 2378-2384.
Tang et al., Evolution of Block Copolymer Lithography to Highly Ordered Square Arrays, Science, vol. 322, No. 5900, (Sep. 25, 2008), pp. 429-432.
Trimbach et al., Block Copolymer Thermoplastic Elastomers for Microcontact Printing, Langmuir, vol. 19, (2003), pp. 10957-10961.
Truskett et al., Trends in Imprint Lithography for Biological Applications, TRENDS in Biotechnology, vol. 24, No. 7, (Jul. 2006), pp. 312-315.
Tseng et al., Enhanced Block Copolymer Lithography Using Sequential Infiltration Synthesis, J. of Physical Chemistry, (Jul. 11, 2011), 16 pgs.
Van Poll et al., A Self-Assembly Approach to Chemical Micropatterning of Poly(dimethylsiloxane), Angew. Chem. Int. Ed. 2007, vol. 46, (2007), pp. 6634-6637.
Wang et al., One Step Fabrication and characterization of Platinum Nanopore Electrode Ensembles formed via Amphiphilic Block Copolymer Self-assembly, Electrochimica Acta 52, (2006), pp. 704-709.
Wathier et al., Dendritic Macromers as in Situ Polymerizing Biomaterials for Securing Cataract Incisions, J. Am. Chem. Soc., vol. 126, No. 40, (2004), pp. 12744-12745, abstract only.
Winesett et al., Tuning Substrate Surface Energies for Blends of Polystyrene and Poly(methyl methacrylate), Langmuir 2003, vol. 19, (2003), pp. 8526-8535.
Wipf, Handbook of Reagents for Organic Synthesis, John Wiley & Sons Lid., (2005), p. 320.
Wu et al., Self-Assembled Two-Dimensional Block Copolymers on Pre-patterned Templates with Laser Interference Lithography, IEEE, (2007), pp. 153-154.
Xia et al., An Approach to Lithographically Defined Self-Assembled Nanoparticle Films, Advanced Materials, vol. 18, (2006), pp. 930-933.
Xia et al., Soft Lithography, Annu. Rev. Maler. Sci., vol. 28, (1998), pp. 153-184.
Xiao et al., Graphoepitaxy of Cylinder-forming Block Copolymers for Use as Templates to Pattern Magnetic Metal Doi Arrays, Nanotechnology 16, IPO Publishing Lid, UK (2005), pp. S324-S329.
Xu et al., Electric Field Alignment of Symmetric Diblock Copolymer Thin Films, Macromolecules, (2003), 5 pgs.
Xu et al., Interfacial Interaction Dependence of Microdomain Orientation in Diblock Copolymer Thin Films, Macromolecules, vol. 38, (2005), pp. 2802-2805.
Xu et al., Surface-Initiated Atom Transfer Radical Polymerization from Halogen-Terminated Si(111) (Si—X, X=Cl, Br) Surfaces for the Preparation of Well-Defined Polymer-Si Hybrids, Langmuir, vol. 21, No. 8, (2005), pp. 3221-3225.
Xu et al., The Influence of Molecular Weight on Nanoporous Polymer Films, Polymer 42, Elsevier Science Lid., (2001), pp. 9091-9095.
Yamaguchi et al., Resist-Pattern Guided Self-Assembly of Symmetric Diblock Copolymer, Journal of Pholopolymer Science and Technology, vol. 19, No. 3, (2006), pp. 385-388.
Yamaguchi et al., Two-Dimensional Arrangement of Vertically Oriented Cylindrical Domains of Diblock Copolymers Using Graphoepitaxy with Artificial Guiding Pattern Layout, Microprocesses and Nanotechnology, 2007, Conference date Nov. 5-8, 2007, pp. 434-435.
Yan et al., Preparation and Phase Segregation of Block Copolymer Nanotube Multiblocks, J. Am. Chem. Soc., vol. 126, No. 32, (2004), pp. 10059-10066.
Yang et al., Covalently Attached Graft Polymer Monolayer on Organic Polymeric Substrate via Confined Surface Inhibition Reaction, J. Polymer Sci.—A—Polymer Chemistry Ed., vol. 45, Issue 5, (2007), pp. 745-755.
Yang et al., Guided Self-Assembly of Symmetric Diblock Copolymer Films on Chemically Nanopattemed Substrates, Macromolecules 2000, vol. 33, No. 26, (2000), pp. 9575-9582.
Yang et al., Nanoscopic Templates Using Self-assembled Cylindrical Diblock Copolymers for Patterned Media, J. Vac. Sci. Technol. B 22(6), (Nov./Dec. 2004), pp. 3331-3334.
Alger, Mark S. M., Polymer Science Dictionary, describing the Flory-Huggins interaction parameter (Chi value, c value) and the Flory-Fluggins theory (1989), pp. 201-202.
Ali et al., Properties of Self-Assembled ZnO Nanostructures, Solid-Slate Electronics, vol. 46, (2002), pp. 1639-1642.
Anonymous, Aluminium oxide, <http://en.wikipedia.org/wiki/Aluminium_oxide>, (visited Feb. 12, 2015), 10 pages.
Anonymous, Electronegativity,<http://www.princeton.edu/-achaney/tmve/wiki100k/docs/Electronegativity.html>, (visited Aug. 28, 2013), 1 page.
Anonymous, Polydimethylsiloxane, <http://en.wikipedia.org/wiki/Polydimethylsiloxane>, (visited Feb. 12, 2015), 11 pages.
Arshady et al., The Introduction of Chloromethyl Groups into Styrene-Based Polymers, 1, Makromol. Chem., vol. 177, (1976), pp. 2911-2918.
Asakawa et al., Fabrication of Subwavelength Structure for Improvement in Light-Extraction Efficiency of Light-Emitting Devices Using a Self-Assembled Pattern of Block Copolymer, Applied Optics, vol. 44, No. 34, (Dec. 1, 2005), pp. 7475-7482.
Bae et al., Surface Modification Using Pholo-Crosslinkable Random Copolymers, Abstract submitted for the Mar. 2006 meeting of The American Physical Society, (submitted Nov. 30, 2005) (accessed online Apr. 5, 2010) <http://absimage.aps.org/image/MWS_MAR06-2005-003641.pdf>.
Balsara et al., Synthesis and Application of Nanostructured Materials, CPMIA, IRG Technical Programs, Leland Stanford Junior Univ., (2006), <http://www.stanford.edu/group/cpima/irg/irg_1 ,him>, 9 pages.
Bang et al., The Effect of Humidity on the Ordering of Tri-block Copolymer Thin Films, Abstract submitted for the Mar. 2007 meeting of The American Physical Society, (submitted Nov. 20, 2006), 1 page.
Bass et al., Microcontact Printing with Octadecanethiol, Applied Surface Science, vol. 226, No. 4, (Apr. 2004), pp. 335-340.

(56) References Cited

OTHER PUBLICATIONS

Bearinger et al., Chemisorbed Poly(propylene sulphide)-Based Copolymers Resist Biomolecular Interactions, Nature Materials, vol. 2, (2003), pp. 259-264.
Berry et al. "Orientational Order in Block Copolymer Films Zone Annealed below the Order-Disorder Transition Temperature," Nano Letters vol. 7, No. 9 Aug. 2007; p. 2789-2794.
Berry et al., Effects of Zone Annealing on Thin Films of Block Copolymers, National Institute of Standards and Technology, Polymers Division, Maryland, USA, (2007), 2 pages.
Black et al., High-Capacity, Self-Assembled Metal-Oxide-Semiconductor Decoupling Capacitors, IEEE Electron Device Letters, vol. 25, No. 9, (Sep. 2004), pp. 622-624.
Black et al., Integration of Self Assembly for Semiconductor Microelectronics, IEEE 2005 Custom Integrated Circuits Conference, IBM T.J. Walson Research Center, (2005), pp. 87-91.
Black et al., Integration of Self-Assembled Diblock Copolymers for Semiconductor Capacitor Fabrication, Applied Physics Letters, vol. 79, No. 3, (2001), pp. 409-411.
Black et al., Nanometer-Scale Pattern Registration and Alignment by Directed Diblock Copolymer Self-Assembly, IEEE Transactions on Nanotechnology, vol. 3, No. 3, (Sep. 2004), pp. 412-415.
Black et al., Polymer Self Asembly in Semiconductor Microelectronics, IBM J. Res. & Dev., vol. 51, No. 5, Sep. 2007, pp. 605-633.
Black et al., Self Assembly in Semiconductor Microelectronics: Self-Aligned Sub-Lithographic Patterning Using Diblocl Copolymer Thin Films, Proc. of SPIE, vol. 6153, (2006), pp. 615302-1-615302-11.
Black, C. T., "Self-Aligned Self-Assembly of Multi-Nanowire Silicon Field Effect Transistors," Appl. Phys. Lett., vol. 87, pp. 163116-1 through 163116-3, 2005.
Black, C. T., Polymer Self-Assembly as a Novel Extension to Optical Lithography, American Chemical Society, ACSNano, vol. 1, No. 3, (2007), pp. 147-150.
Botelho Do Rego et al., Diblock Copolymer Ultrathin Films Studied by High Resolution Electron Energy Loss Spectroscopy, Surface Science, 482-485, (2001), pp. 1228-1234.
Brydson et al. (chapter authors), Generic Methodologies for Nanotechnology: Classification and Fabrication, Nanoscale Science and Technology, John Wiley & Sons, Lid., (Dec. 20, 2005), pp. 1-55.
Bulpitt et al., New Strategy for Chemical Modification of Hyaluronic Acid: Preparation of Functionalized Derivatives and Their Use in the Formation of Novel Biocompatible Hydrogels, Journal of Biomedical Materials Research, vol. 47, Issue 2, (Aug. 1999) pp. 152-169, Abstract only.
Canaria et al., Formation and Removal of Alkylthiolate Self-Assembled Monolayers on Gold in Aqueous Solutions, Lat Chip 6, (2006). pp. 289-295. Abstract only.
Candau et al., Synthesis and Characterization of Polystyrene-poly(ethylene oxide) Graft Copolymers, Polymer, vol. 18, (1977), pp. 1253-1257.
Cavicchi et al., Solvent Annealed Thin Films of Asymmetric Polyisoprene-Polylactide Diblock Copolymers, Macromolecules 2007, vol. 40, (2007), pp. 1181-1186.
Cha et al., Biomimetic Approaches for Fabricating High-Density Nanopatterned Arrays, Chem. Mater., vol. 19, (2007), pp. 839-843.
Chai et al., Assembly of Aligned Linear Metallic Patterns on Silicon, Nature Nanotechnology, vol. 2, (Aug. 2007), pp. 500-506.
Chai et al., Using Cylindrical Domains of Block Copolymers to Self-Assemble and Align Metallic Nanowires, American Chemical Society, www.acsnano.org, (2008), pp. A-M.
Chandekar et al., Template-Directed Adsorption of Block Copolymers on Alkanelhiol-Pallemed Gold Surfaces, (2006), http://www.nano.neu.edu/industry/industry_showcase/industry_day/documenls/Chandekar.pdf) (PowerPoinltemplate for scientific posters (Swarthmore College)), 1 page.
Chang et al., Diblock Copolymer Directed Self-Assembly for CMOS Device Fabrication, Proc. of SPIE, vol. 6156, (2006), pp. 615611-1-615611-6.
Chang, et al., Experimental Demonstration of Aperiodic Patterns of Directed Self-Assembly by Block Copolymer Lithography for Random Logic Circuit Layout, IEEE International Electron Devices Meeting (IEDM), paper 33.2, (Dec. 6-8, 2010), pp. 33.2.1-33.2.4.
Chen et al., Highly Ordered Arrays of Mesoporous Silica Nanorods with Tunable Aspect Ratios from Block Copolymer Thin Films, Advanced Materials, vol. 20, (2008), pp. 763-767.
Cheng et al., "Templated Self-Assembly of Block Copolymers: Top-Down Helps Bottom-Up," Adv. Mater. (2006), vol. 18, pp. 2505-2521.
Cheng et al., Rapid Directed Self Assembly of Lamellar Microdomains from a Block Copolymer Containing Hybrid, Applied Physics Letters, vol. 91, (2007), pp. 143106-1-143106-3.
Cheng et al., Self-Assembled One-Dimensional Nanostructure Arrays, Nano Letters, vol. 6, No. 9, (2006), pp. 2099-2103.
Cheng et al., Templated Self-Assembly of Block Copolymers: Effect of Substrate Topography, Adv. Mater., vol. 15, No. 19, (2003), pp. 1599-1602.
Cho et al., Nanoporous Block Copolymer Micelle/Micelle Multilayer Films with Dual Optical Properties, J. Am. Chem. Soc., vol. 128, No. 30, (2006), pp. 9935-9942.
Choi et al., Magnelorheology of Synthesized Cor Shell Structured Nanoparticle, IEEE Transactions on Magnetics, vol. 41, No. 10, (Oct. 2005), pp. 3448-3450.
Clark et al., Selective Deposition in Multilayer Assembly: SAMs as Molecular Templates, Supramolecular Science, vol. 4, (1997), pp. 141-146.
Daoulas et al., Fabrication of Complex Three-Dimensional Nanostructures from Self-Assembling Block Copolymer Materials on Two-Dimensional Chemically Patterned Templates with Mismatched Symmetry, Physical Review Letters 96, week ending Jan. 27, 2006, pp. 036104-1-036104-3.
Darling, Directing the Self-Assembly of Block Copolymers, Progress in Polymer Science, vol. 32, No. 10, (Jun. 2, 2007), pp. 1152-1204.
Desai et al., Engineered Silicon Surfaces for Biomimetic Interfaces, Business Briefing: Medical Device Manufacturing & Technology, (2002), pp. 1-4.
Edwards et al., Mechanism and Kinetics of Ordering in Diblock Copolymer Thin Films on Chemically Nanopatterned Substrates, Journal of Polymer Science: Part B: Polymer Physics, vol. 43, (2005), pp. 3444-3459.
Edwards et al., Precise Control over Molecular Dimensions of Block-Copolymer Domains Using the Interfacial Energy of Chemically Nanopatterned Substrates, Advanced Maler., vol. 16, No. 15, (Aug. 4, 2004), pp. 131 1319.
Elisseeff et al., Photoencapsulation of Chondrocytes in Poly(ethylene oxide)-Based Semi-Interpenetrating Networks, Journal of Biomedical Materials Research, vol. 51, No. 2, (Aug. 2000), pp. 164-171, (Abstract only).
Erlandsson et al., Metallic Zinc Reduction of Disulfide Bonds Between Cysteine Residues in Peptides and Proteins, Int'l J. Peptide Res. & Therapeutics, vol. 11, No. 4, (Dec. 2005), pp. 261-265.
Fasolka et al., Block Copolymer Thin Films: Physics and Applications, Annual Review of Materials Res., vol. 31, (Aug. 2001), pp. 323-355.
Yu et al., Contact Printing Beyond Surface Roughness: Liquid Supramolecular Nanostamping, Advanced Materials, vol. 19, (2007), pp. 4338-4342.
Yurt et al., Scission of Diblock Copolymers into Their Constituent Blocks, Macromolecules 2006, vol. 39, No. 5, (2006), pp. 1670-1672.
Zaumseil et al., Three-Dimensional and Multilayer Nanostructures Formed by Nanotransfer Printing, Nano Letters, vol. 3, No. 9, (2003), pp. 1223-1227.
Zehner et al., Selective Decoration of a Phase-Separated Diblock Copolymer with Thiol-Passivated Gold Nanocrystals, Langmuir, vol. 14, No. 2, (Jan. 20, 1998), pp. 241-244.
Zhang et al., Highly Ordered Nanoporous Thin Films from Cleavable Polystyrene-block-poly(ethylene oxide), Adv. Maler., vol. 19, (2007), pp. 1571-1576.

(56) References Cited

OTHER PUBLICATIONS

Zhang et al., Phase Change Nanodot Arrays Fabricated Using a Self-Assembly Diblock Copolymer Approach, Applied Physics Letters, vol. 91, (2007), pp. 013104-013104-3.
Zhang et al., Self-Assembled Monolayers of Terminal Alkynes on Gold, J_ Am. Chem. Soc., vol. 129, No. 16, (2007), pp. 4876-4877.
Zhao et al., Colloidal Subwavelength Nanostructures for Antireflection Optical Coatings, Optics Letters, vol. 30, No. 14, (Jul. 15, 2005), pp. 1885-1887.
Zhou et al., Nanoscale Metal/Self-Assembled Monolayer/Metal Heterostructures, Appl. Phys. Lett., vol. 71, No. 5, Aug. 4, 1997, pp. 611-613.
Zhu et al., Grafting of High-Density Poly(Ethylene Glycol) Monolayers on Si(111), Langmuir, vol. 17, (2001), pp. 7798-7803.
Zhu et al., Molecular Assemblies on Silicon Surfaces via Si—O Linkages, Langmuir, vol. 16, (2000), pp. 6766-6772.

* cited by examiner

METHODS OF FORMING NANOSTRUCTURES INCLUDING METAL OXIDES USING BLOCK COPOLYMER MATERIALS

CROSS-REFERENCE TO RELATED APPLICATIONS

This application is a divisional of U.S. patent application Ser. No. 16/049,329, filed Jul. 30, 2018, now U.S. Pat. No. 11,532,477, issued Dec. 20, 2022, which is a divisional of U.S. patent application Ser. No. 14/920,018, filed Oct. 22, 2015, now U.S. Pat. No. 10,049,874, issued Aug. 14, 2018, which is a divisional of U.S. patent application Ser. No. 14/040,245, filed Sep. 27, 2013, now U.S. Pat. No. 9,177,795, issued Nov. 3, 2015, the disclosure of each of which is hereby incorporated herein in its entirety by this reference.

FIELD

The present disclosure, in various embodiments, relates generally to methods of preparing nanostructures from self-assembled block copolymer materials selectively permeated with metal oxides and to semiconductor structures including such nanostructures.

BACKGROUND

A continuing goal of integrated circuit fabrication is to decrease the dimensions thereof. Integrated circuit dimensions can be decreased by reducing the dimensions and spacing of the constituent features or structures. For example, by decreasing the dimensions and spacing of features (e.g., storage capacitors, access transistors, access lines) of a memory device, the overall dimensions of the memory device may be decreased while maintaining or increasing the storage capacity of the memory device.

As the dimensions and spacing of semiconductor device features become smaller, conventional lithographic processes become increasingly more difficult and expensive to conduct. Therefore, significant challenges are encountered in the fabrication of nanostructures, particularly structures having a feature dimension (e.g., critical dimension) of less than a resolution limit of conventional photolithography techniques (about 50 nm). It is possible to fabricate semiconductor structures of such feature dimensions using a conventional lithographic process, such as shadow mask lithography and e-beam lithography. However, use of such processes is limited because the exposure tools are extremely expensive or extremely slow and, further, may not be amenable to formation of structures having dimensions of less than 50 nm.

The development of new lithographic processes, as well as materials useful in such processes, is of increasing importance to make the fabrication of small-scale devices easier, less expensive, and more versatile. One example of a method of fabricating small-scale devices that addresses some of the drawbacks of conventional lithographic techniques is self-assembled block copolymer lithography.

In self-assembled block copolymer lithography, block copolymer materials formed on a substrate are subject to microphase segregation, such as by annealing, to self-assemble the block copolymer materials into ordered nano-scale domains of one block of the block copolymer materials in a matrix of the other block of the block copolymer materials. Then, the domains of one block in the self-assembled block copolymer materials may be selectively removed, leaving the domains of the other block as an etch mask on the substrate. Dimensions of the self-assembled domains so formed are conventionally in the range of 5 nm to 50 nm, which are the dimensions that are extremely difficult to define using conventional lithographic techniques. Therefore, self-assembled block copolymer materials are useful as an etch mask in fabrication of nano-scale semiconductor devices.

Although the self-assembled block copolymer lithography is useful for fabrication of semiconductor structures having dimensions of less than 50 nm, there are still problems that must be addressed. Self-assembled block copolymer structures including the self-assembled block copolymer materials may not provide nano-scale etch masks with sufficient pattern fidelity in terms of line edge and roughness. For example, the self-assembled block copolymer structures often include undesirable random curvatures at the interfaces of domains, resulting in nano-scale etch masks having undesirably high degree of edge roughness and inconsistent widths. One conventional approach to address this problem is by removing (i.e., cutting, chopping) the portions of self-assembled block copolymer domains having undesirable random curvatures, prior to further processing the self-assembled block copolymer structures into nano-scale etch masks.

Additionally, the different domains of the self-assembling block copolymer structures often have little or no etch selectivity from one another. Therefore, improving etch selectivity of the self-assembled domains is desirable.

Accordingly, there is a need for more reliable and less expensive fabrication techniques which are suitable for fabricating complex devices with the desired enhanced density to meet future demands.

BRIEF DESCRIPTION OF THE DRAWINGS

FIGS. 7-12A and 12B are isometric views of various stages in the preparation of nanostructures from self-assembled block copolymer compositions selectively permeated with metal oxides according to another embodiment of the present disclosure; and FIGS. 13-17A and 17B are isometric views of various stages in the preparation of nanostructures from self-assembled block copolymer compositions selectively permeated with metal oxides according to yet another embodiment of the present disclosure.

DETAILED DESCRIPTION

Figure 1:
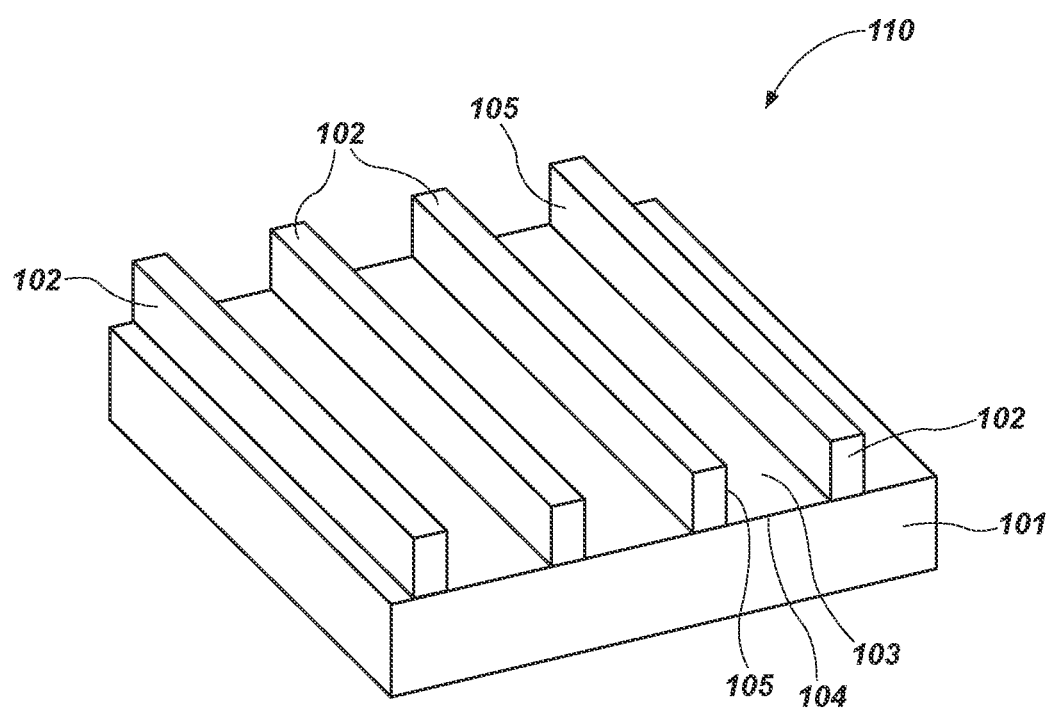
FIGS. 1-6 are isometric views of various stages in the preparation of nanostructures from self-assembled block copolymer compositions selectively permeated with metal oxides according to an embodiment of the present disclosure.

The following description provides specific details, such as material types, material thicknesses, and processing conditions in order to provide a thorough description of embodiments of the disclosure. However, a person of ordinary skill in the art will understand that embodiments of the present disclosure may be practiced without employing these specific details. Indeed, the embodiments of the present disclosure may be practiced in conjunction with conventional fabrication techniques employed in the industry.

In addition, the description provided herein does not form a complete process flow for forming a semiconductor device structure, and the semiconductor device structures described below do not form a complete semiconductor device. Only those process acts and structures necessary to understand the embodiments of the present disclosure are described in detail below. Additional acts to form the complete semiconductor device may be performed by conventional fabrication techniques. Also, the drawings accompanying the application are for illustrative purposes only, and are thus not necessarily drawn to scale. Elements common between figures may retain the same numerical designation. Furthermore, while the materials described and illustrated herein may be formed as layers, the materials are not limited thereto and may be formed in other three-dimensional configurations.

As used herein, any relational terms, such as "first," "second" and "third," or "top," "middle" and "bottom," are used for clarity and convenience in understanding the present disclosure and accompanying drawings and does not connote or depend on any specific preference, orientation or order. It is understood that, although the terms "first," "second," "third," "top," "middle" and "bottom" are used herein to describe various elements, these elements should not be limited by these terms. These terms are only used to distinguish one element from another.

As used herein, the term "substantially," in reference to a given parameter, property or condition, means to a degree that one of ordinary skill in the art would understand that the given parameter, property, or condition is met with a small degree of variance, such as within acceptable manufacturing tolerances.

As used herein, the term "substrate" means and includes a base material or construction upon which additional materials are formed. The substrate may be, for example, a semiconductor substrate, a base semiconductor material on a supporting structure, a metal electrode or a semiconductor substrate having one or more materials, structures or regions formed thereon. The substrate may be a conventional silicon substrate, or other bulk substrate comprising a layer of semiconductive material. As used herein, the term "bulk substrate" means and includes not only silicon wafers, but also silicon-on-insulator (SOI) substrates, silicon-on-sapphire (SOS) substrates and silicon-on-glass (SOG) substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process acts may have been conducted to form materials, regions, or junctions in the base semiconductor structure or foundation. In one embodiment, the substrate is a silicon-containing material, such as a silicon substrate. The substrate may be doped or undoped.

As used herein, the terms "polymer block" or "block" mean and include a grouping of multiple monomer units of a single type (i.e., a homopolymer block) or multiple types (i.e., a copolymer block) of constitutional units into a continuous polymer chain of a desired length that forms part of a larger polymer of an even greater length.

As used herein, the term "block copolymer" means and includes a polymer composed of chains where each chain contains two or more polymer blocks as defined above and at least two of the blocks are of sufficient segregation strength for those blocks to phase separate. A wide variety of block copolymers are contemplated herein including diblock copolymers (i.e., polymers including two polymer blocks), triblock copolymers (i.e., polymers including three polymer blocks), multiblock copolymers (i.e., polymers including more than three polymer blocks), or combinations thereof.

As used herein, the term "amphiphilic block copolymer" means and includes a block copolymer material as defined above with the two or more polymer blocks having different solubilities (i.e., at least one hydrophilic block and at least one hydrophobic block) in water.

The terms "microphase segregation" or "microphase separation," as used herein, mean and include the property by which homogeneous blocks of a block copolymer material aggregate mutually, and heterogeneous blocks of a block copolymer material separate into distinct domains.

The terms "annealing" or "anneal," as used herein, mean and include treatment of the block copolymer material so as to enable sufficient microphase separation between two or more different blocks of the block copolymer material to self-assemble into an ordered pattern defined by repeating structural units formed from the blocks.

The term "preferential wetting," as used herein, means and includes wetting of a block copolymer material wherein the contacting surface at an interface wets one block of the block copolymer material more easily than the other block(s).

The term "neutral wetting," as used herein, means and includes wetting of a block copolymer material wherein the contacting surface at an interface wets all blocks of the block copolymer material substantially equally.

The term "activatable catalyst," as used herein, means and includes a material that functions as catalyst upon application of an activation energy, such as photo or thermal energy, and that does not function as a catalyst unless activated.

FIGS. 1-6 show various stages in the preparation of nanostructures from self-assembled block copolymer material selectively permeated with metal oxides according to an embodiment of the present disclosure, wherein the self-assembling of the block copolymer material is directed through graphoepitaxy technique.

FIG. 1 shows a patterned material 110 including a substrate 101, spacers 102 on the substrate 101, and trenches 103 defined by a floor 104 (e.g., surface of the substrate 101) and sidewalls 105 of spacers 102. The patterned material 110 may be formed using any conventional techniques and, therefore, is not described in detail herein. Although the patterned material 110 of FIG. 1 shows three trenches, it is understood that the patterned material 110 may include one trench, two trenches, or more than three trenches.

Figure 2:
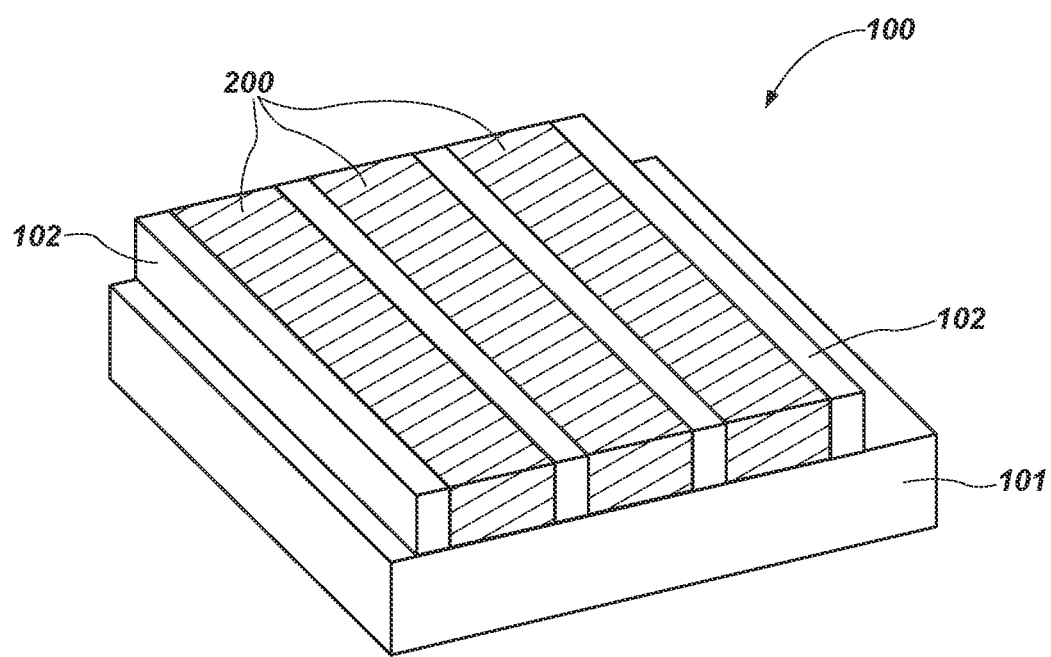

As shown in FIG. 2, the trenches 103 of the patterned material 110 may be substantially filled with a block copolymer composition 200 to provide a semiconductor structure 100. The block copolymer composition 200 may be formed in the trenches 103 by any suitable technique including, but not limited to, spin-coating, blanket coating, spraying, ink coating, or dip coating. Alternatively, the materials may be grown in situ. Depending on the specific block copolymer composition 200 to be used, the technique for depositing or growing the material may be selected by a person of ordinary skill in the art. While the block copolymer composition 200 described and illustrated herein may be formed as a layer, the materials are not limited thereto and may be formed in other three-dimensional configurations.

The block copolymer composition 200 may include a block copolymer material and an activatable catalyst having higher affinity for one block of the block copolymer material than the other block(s) of the block copolymer material. As a non-limiting example, the activatable catalyst may be a hydrophilic compound, and therefore has higher affinity to the more hydrophilic block than the less hydrophilic (i.e., less polar or non-polar) block of the block copolymer material.

In some embodiments, the block copolymer material may include a more polar block and a less polar block, wherein the activatable catalyst has a higher affinity for the more polar block of the block copolymer material relative to the less polar block. In some embodiments, the volume fraction of the more polar block and the less polar block in the block copolymer material may be from about 20:80 to about 50:50.

In some embodiments, the block copolymer material may be an amphiphilic block copolymer that includes at least one hydrophilic block and at least one hydrophilic block, wherein the activatable catalyst has a higher affinity for the hydrophilic block of the block copolymer material relative to the hydrophobic block.

By way of non-limiting examples, the block copolymer material may include poly(styrene)-b-poly(methylmethacrylate) (PS-b-PMMA), poly(styrene)-b-polyacrylate (PS-b-PA), poly(styrene)-b-poly(methacrylate) (PS-b-PMA), poly(styrene)-b-poly(vinylpyridine) (PS-b-PVP), poly(styrene)-b-poly(lactide) (PS-b-PLA), poly(styrene)-b-poly(tert-butyl acrylate) (PS-b-PtBA), poly(styrene)-b-poly(ethylene-co-butylene (PS-b-(PS-co-PB)), poly(styrene)-b-poly(ethyleneoxide) (PS-b-PEO), poly(isoprene)-b-poly(ethyleneoxide) (PI-b-PEO), poly(isoprene)-b-poly(methylmethacrylate) (PI-b-PMMA), poly(butadiene)-b-poly(ethyleneoxide) (PBD-b-PEO), polystyrene-block-polydimethylsiloxane (PS-b-PDMS), polyethyleneoxide-b-polymethylmethacrylate (PEO-b-PMMA), polystyrene-b-poly(9,9-bis(6'-N,N,N-trimethylammonium)hexyl)-fluorene phenylene) (PS-b-PFP), polyethylethylene-b-polyethyleneoxide (PEE-b-PEO), polystyrene-b-polyisoprene (PS-b-PI), polystyrene-b-polybutadiene (PS-b-PBD), polystyrene-b-polyferrocenyldimethylsilane (PS-b-PFS), polybutadiene-b-polyvinylpyridine (PBD-b-PVP), polyisoprene-b-polymethylmethacrylate (PI-b-PMMA), poly(styrene)-b-PEO block copolymer having a cleavable junction between PS and PEO blocks, poly(styrene)-b-poly(methylmethacrylate) doped with PEO-coated gold nanoparticles, poly(styrene)-b-poly(2-vinylpyridine) (PS-b-P2VP) block copolymer having a cleavable junction, poly(styrene-b-methyl methacrylate-b-ethylene oxide) (PS-b-PMMA-b-PEO), poly(styrene-b-methyl methacrylate-b-styrene) (PS-PMMA-PS), poly(methyl methacrylate-b-styrene-b-methyl methacrylate) (PMMA-PS-PMMA), poly(styrene-b-poly(isoprene)-b-styrene) (PS-b-PI-b-PS), or combinations thereof.

The activatable catalyst may be activatable acid catalyst, activatable base catalyst, or a mixture thereof. By way of non-limiting examples, the activatable acid catalyst may be photo acid generator (PAG), thermal acid generator (TAG), or a mixture thereof. By way of non-limiting examples, the activatable base catalyst may be photo base generator (PBG), thermal base generator (TBG), or a mixture thereof. Non-limiting examples of PAGs may include iodonium sulfonate compounds, sulfonium sulfonate compounds, sulfonium triflate compounds, iodonium triflate compounds, iodonium phosphate compounds, imide sulfonate compounds, triazine compounds, diazodisulfone compounds, or a mixture thereof. Non-limiting examples of TAGs may include alkyl ester compounds, sulfonic ester compounds, organic sulfonic acid compounds, blocked alkyl phosphoric acid compounds, blocked perfluoralkyl sulfonic acid compounds, alkyl phosphoric acid/amine complexes, amine compounds, quaternary ammonium compounds, or combinations thereof. Non-limiting examples of PBGs may include sulfonamide compounds, carbamate compounds, O-acyloxime compounds, nifedipine compounds, formamide compounds, ammonium salts, amineimide compounds, alpha-aminoketone compounds, aromatic urea compounds, metallocene compounds, transition metal complexes, or a mixture thereof. Non-limiting examples of TBGs may include acyloxyimino compounds.

As the activatable catalyst has higher affinity for one block of the block copolymer material than the other block(s), the block copolymer material, upon exposure to conditions that cause self-assembly of the block copolymer composition, may include activatable catalyst selectively in one block of the copolymer material and not in the other block(s).

The amount of activatable catalyst in the block copolymer composition may be varied depending on various factors, including, but are not limited to, the morphologies of the self-assembled domains of the block copolymer material, the chemical structures of the more polar blocks, the chemical structure of the activatable catalyst, the processing time and temperature, etc. As discussed in detailed hereinafter, the different morphologies of self-assembled domains have different volume fractions of the more and less polar blocks, and therefore different morphologies of self-assembled domains require different amounts of the activatable catalyst. In some embodiments, the amount of the activatable catalyst may not be more than about 20% by weight of the block copolymer composition. When the amount of the activatable catalyst in the composition is too high, the activatable catalyst may affix to the less polar block of the block copolymer material in addition to the more polar block, resulting in poor selectivity of the activatable catalyst for the desired domains of the self-assembled structure, and consequently poor fidelity of the nanostructures. On the contrary, when the amount of the activatable catalyst in the composition is too low, the formation of metal oxide in the self-assembled structure may be unacceptable low due to insufficient reaction of generated catalyst and the metal oxide precursor within reasonable processing conditions.

The block copolymer composition 200 in the trenches 103 may be subject to microphase separation to self-assemble the block copolymer composition into domains of a first block of the block copolymer material and domains of a second block, wherein the first block is more polar than the second block and includes the activatable catalyst. Microphase separation of the block copolymer composition may be achieved using any conventional process and therefore is not described in detail herein. In some embodiments, the block copolymer composition may be subject to annealing process to cause microphase separation. For way of non-limiting examples, the annealing process may include thermal annealing, solvent vapor-assisted annealing, supercritical fluid-assisted annealing, photo annealing, or a combination thereof.

Figure 3:
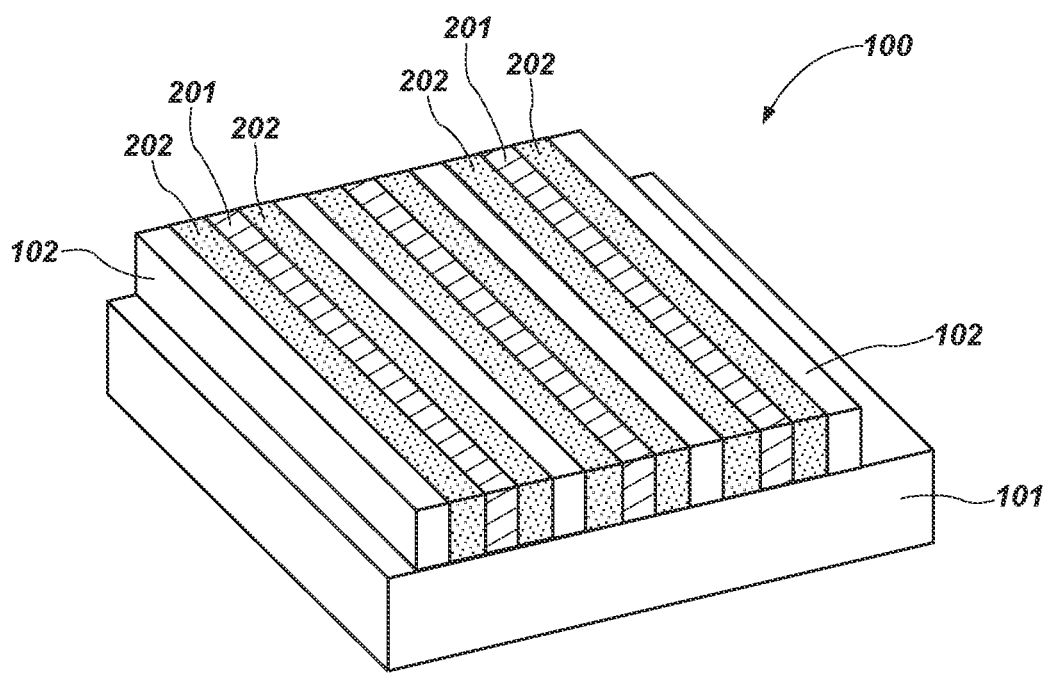

Referring to FIG. 3, upon microphase separation, the block copolymer composition 200 self-assembles into domains 201 composed of a first block and an activatable catalyst in a matrix 202 composed of a second block of the block copolymer material, wherein the first block is more polar than the second block. In some embodiments, as shown in FIG. 3, the more polar block is a minor block and forms domains 201 within the matrix 202 of the less polar block, and the self-assembled structure has the activatable catalyst selectively in the minor domains 201 and not in the matrix 202. Alternatively, in some embodiments, the more polar block may be a majority block and form a matrix for domains of the less polar block, and the self-assembled structure has the activatable catalyst selectively in the matrix of the more polar block and not in the minor domains of the less polar block.

In some embodiments, as shown in FIGS. 1-6, the microphase separation of the block copolymer composition to form self-assembled nano-scale structures may be achieved by graphoepitaxy technique. The floor 104 and sidewalls 105 of the trench 103 guide self-assembly of the blocks of the block copolymer composition 200 to form self-assembled domains 201 including at least one polymer block within a matrix 202 of at least one different polymer block.

In some embodiments, the self-assembled nano-scale structures of the block copolymer composition may be achieved by chemoepitaxy technique, which will be discussed in FIGS. 13-17. In yet further embodiments, a combination of chemically and topographically patterned substrates may be used to direct the self-assembly of the block copolymer composition.

Various size and shape of the self-assembled domains may be formed from microphase separation of the block copolymer composition. By way of non-limiting examples, the self-assembled domains may have lamellar, cylindrical, half cylindrical, or spherical morphologies, among others. The size and shape of the self-assembled domains formed from microphase separation of the block copolymer composition may be controlled by various factors depending on the characteristics of the block copolymer material in the composition, as well as the wetting ability of the interface surfaces with the block copolymer composition. The molecular weight and volume fraction of the different polymer blocks of the block copolymer material may contribute to the size and shape of the self-assembled domains. For example, for volume fractions at ratios greater than about 80:20 of the two blocks (A:B) of a diblock AB copolymer, the block copolymer composition may microphase separate and self-assemble into spherical domains with spheres of block B surrounded by a matrix of block A. For volume fractions of the two blocks (A:B) between about 60:40 and about 80:20, the block copolymer composition may self-assemble into a single array or hexagonal array of cylinders of block B within a matrix of block A. For volume fractions of the two blocks (A:B) between about 50:50 and 60:40, alternating lamellar domains of the A and B blocks may be formed. In some embodiments, the size of self-assembled domains may be from about 5 nm to about 50 nm. Furthermore, the morphologies of the self-assembled block copolymer composition may be directed by the wetting abilities of the interface surfaces (e.g., the floor and sidewalls of the trench). As a non-limiting example, when the block copolymer composition is formed within the trench having a neutral wetting floor and preferentially wetting sidewalls, the block copolymer composition may self-assemble into alternating lamellar domains oriented perpendicular to the floor of the trench and parallel to the sidewalls, or cylindrical domains in a single array or hexagonal array perpendicular to the floor of the trench and parallel to the sidewalls. As a non-limiting example, when the block copolymer composition is formed within the trench having preferentially wetting floor and sidewalls, the block copolymer composition may self-assemble into half cylindrical domains oriented parallel to both the floor and sidewalls of the trench.

Figure 4:
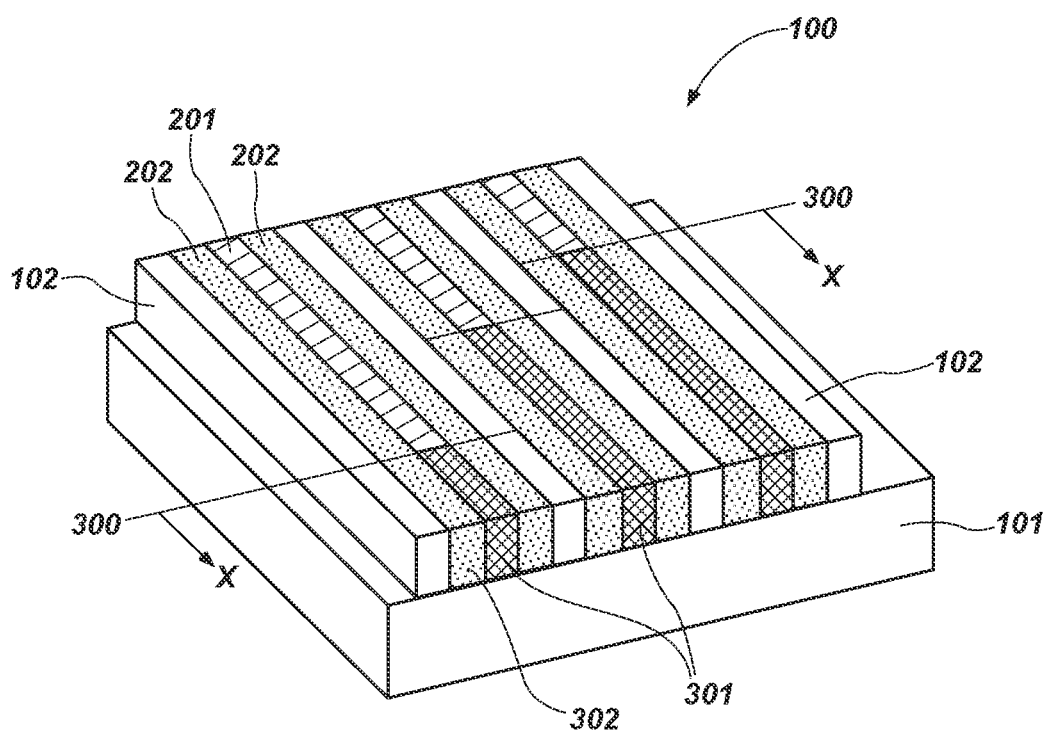

In FIG. 4, selected portions of the semiconductor structure 100 (i.e., area below line 300-300 in direction of "X") may be subjected to activation energy to generate catalyst from the activatable catalyst in the selected portions. Thus, the self-assembled structure in the selected portions may include catalyst-containing domains 301 composed of the first block and the generated catalyst, and domains 302 composed of the second block of the block copolymer material. The domains 302 may be substantially the same as the matrix 202, since there is substantially no activatable catalyst in the matrix 202, and, consequently, no generated catalyst in the domains 302. The activatable catalyst in the non-activated portions of structure 100 is not subject to activation energy, and therefore no catalyst is generated from the activatable catalyst in the domains 201 of the non-activated portions of structure 100. Non-limiting examples of activation energy may include photo energy or thermal energy. The activation energy may be applied to only the selected portions of the semiconductor structure 100 using any conventional technique, which is not described in detail herein. By way of non-limiting examples, the technique may be a masking technique, direct application technique (i.e., without using mask), or a combination thereof. The selection of activation energy may be based on various factors including, but not limited to, the type of activatable catalyst (e.g., thermal or photo generated catalyst), the chemical structure of activatable catalyst, or the desirable rate of activation.

Figure 5:
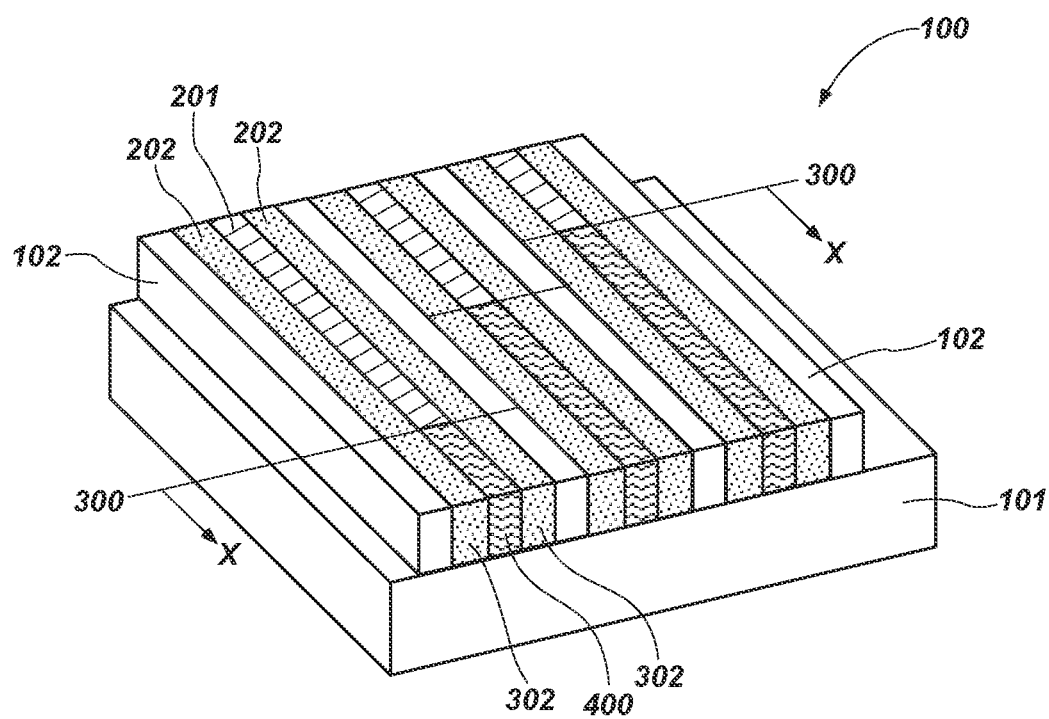

FIG. 5 shows the semiconductor structure 100 obtained after exposing the semiconductor structure 100 of FIG. 4 to a metal oxide precursor. The generated catalyst (e.g., acid or base) may react with the metal oxide precursor through a condensation reaction, resulting in a formation of metal oxide. Thus, the generated catalyst in the catalyst-containing domains 301 may react with the metal oxide precursor through a condensation reaction to form metal oxide, resulting in metal oxide-containing domains 400 that include the first block of the block copolymer material and metal oxide. As the domains 201, 302 and matrix 202 of the semiconductor structure 100 do not have the generated catalyst, no metal oxide is formed in these domains. Therefore, the metal oxide is selectively incorporated at the selected portions of the semiconductor structure 100 and at the selected time, by controlling the location and time for the application of the activation energy to the semiconductor structure 100.

Various known metal oxide precursors may be used. Non-limiting examples of metal oxide precursors may include metal alkoxide, metal chloride, metal β-diketonate, etc. A variety of metal oxides may be selectively permeated in the self-assembled structure. Non-limiting examples of metal for metal oxides may include titanium (Ti), aluminum (Al), zirconium (Zr), hafnium (Hf), or silicon (Si). The metal oxide precursor may be in gas phase, liquid phase, or solid form. In some embodiments, the metal oxide precursor is in gas phase.

Figure 6:
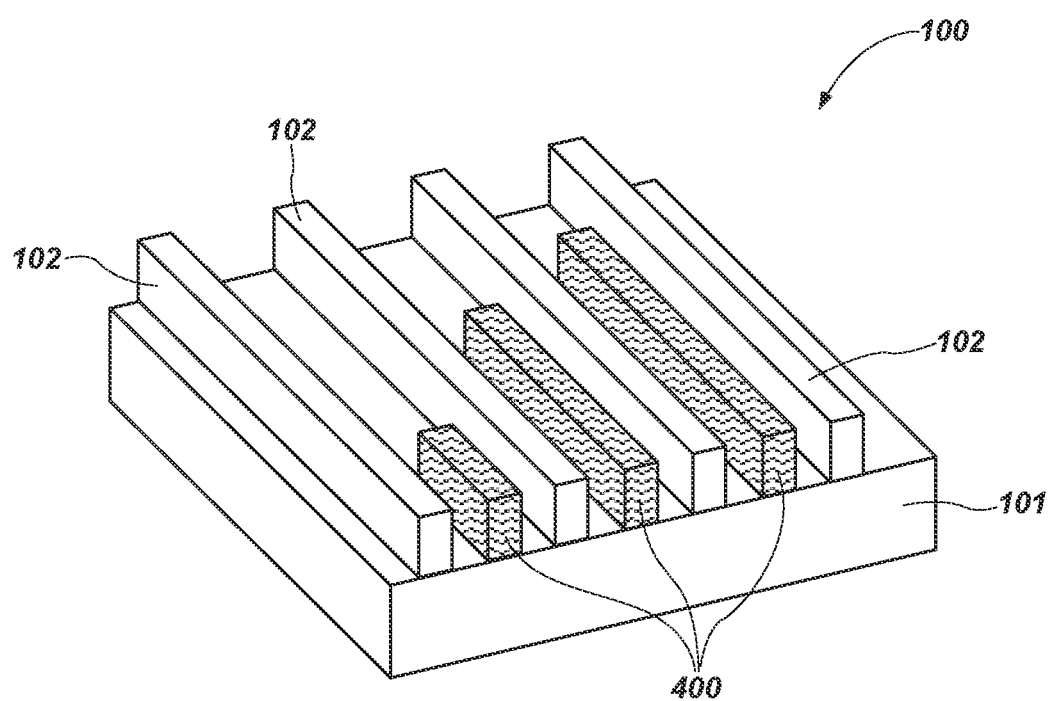

In some embodiments, as shown in FIG. 6, the domains 201, 302 and matrix 202 of the semiconductor structure 100 of FIG. 5 may be removed, leaving the domain 400 that includes the first block and the metal oxide on the substrate 101. Since the domains 201, 302 and matrix 202 do not include the metal oxide, the domains 201, 302 and matrix 202 may be selectively removed using any conventional process, which is not described in detail herein. Thus, by incorporating the metal oxide into a portion of the block copolymer material, the etch selectivity of the block copolymer material may be increased.

A method of forming nano structures may comprise forming a block copolymer composition within a trench in a material on a substrate, wherein the block copolymer composition may comprise a block copolymer material and an activatable catalyst having a higher affinity for a first block of the block copolymer material compared to a second block of the block copolymer material; self-assembling the block copolymer composition into first domains comprising the first block and the activatable catalyst, and second domains comprising the second block; generating catalyst from the activatable catalyst in at least one portion of the first domains to produce a structure comprising catalyst-containing domains and the second domains, the catalyst-containing domains comprising the first block and the catalyst; and reacting a metal oxide precursor with the catalyst in the catalyst-containing domains to produce a metal oxide-containing structure comprising the first block and metal oxide.

A self-assembled nanostructure may comprise first domains and second domains, wherein the first domains may comprise a first block of a block copolymer material and an activatable catalyst, and the second domains may comprise a second block of the block copolymer material and substantially without the activatable catalyst, and wherein the activatable catalyst is capable of generating catalyst upon application of activation energy, the catalyst capable of reacting with a metal oxide precursor to provide a metal oxide.

As discussed above, the formation of the metal oxide at certain portions of the self-assembled block copolymer structure may be accomplished by applying the activation energy to the selected portions of the structure to generate catalyst from the activatable catalyst at the selected portions, and the generated catalyst reacts with the metal oxide precursor to form metal oxide at the selected portions of the self-assembled block copolymer structure.

FIGS. 7-12A and 12B show various stages in the preparation of nanostructures from self-assembled block copolymer materials according to another embodiment of the present disclosure, wherein different metal oxides may be formed at different portions of the self-assembled block copolymer structure.

Figure 7:
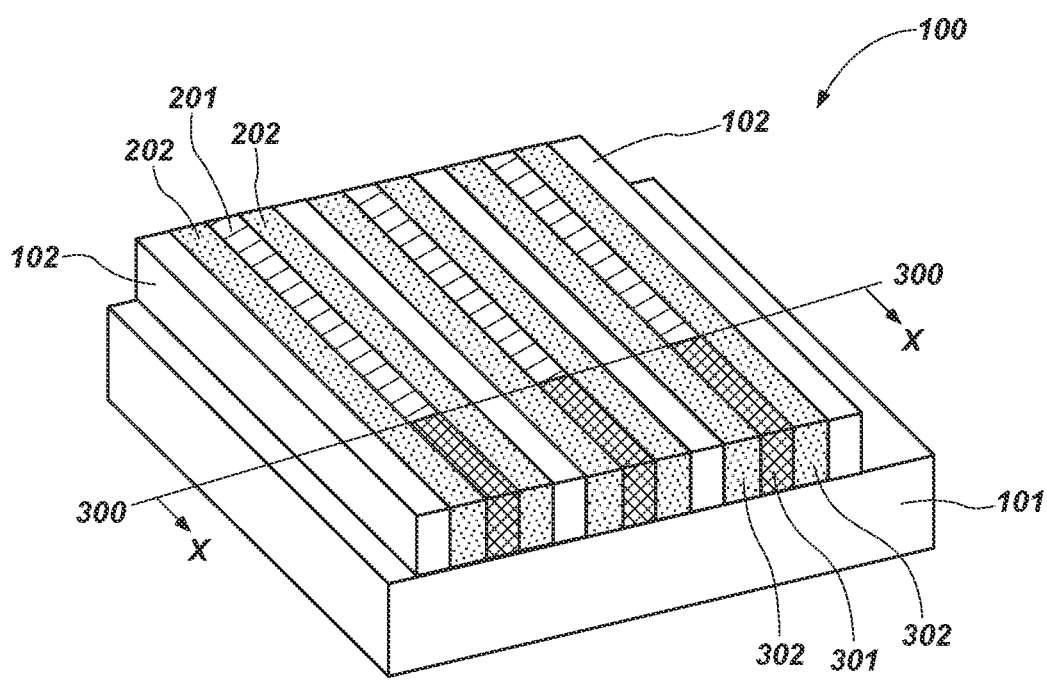

FIG. 7 shows the semiconductor structure 100 obtained by applying activation energy to the selected portion (i.e., area below the line 300-300 in direction of "X") of the semiconductor structure 100 of FIG. 3 to generate catalyst from the activatable catalyst in the selected portions. As shown in FIG. 7, the selected portions of the self-assembled block copolymer structure include domains 301 composed of the first block and the generated catalyst, and domains 302 composed of the second block of the block copolymer material. The domains 302 may be substantially the same as the matrix 202, since there is substantially no activatable catalyst in the matrix 202. Therefore, the self-assembled block copolymer structure of FIG. 7 may include the generated catalyst selectively in the domains 301, and not in the domains 201, 302 and matrix 202.

Figure 8:
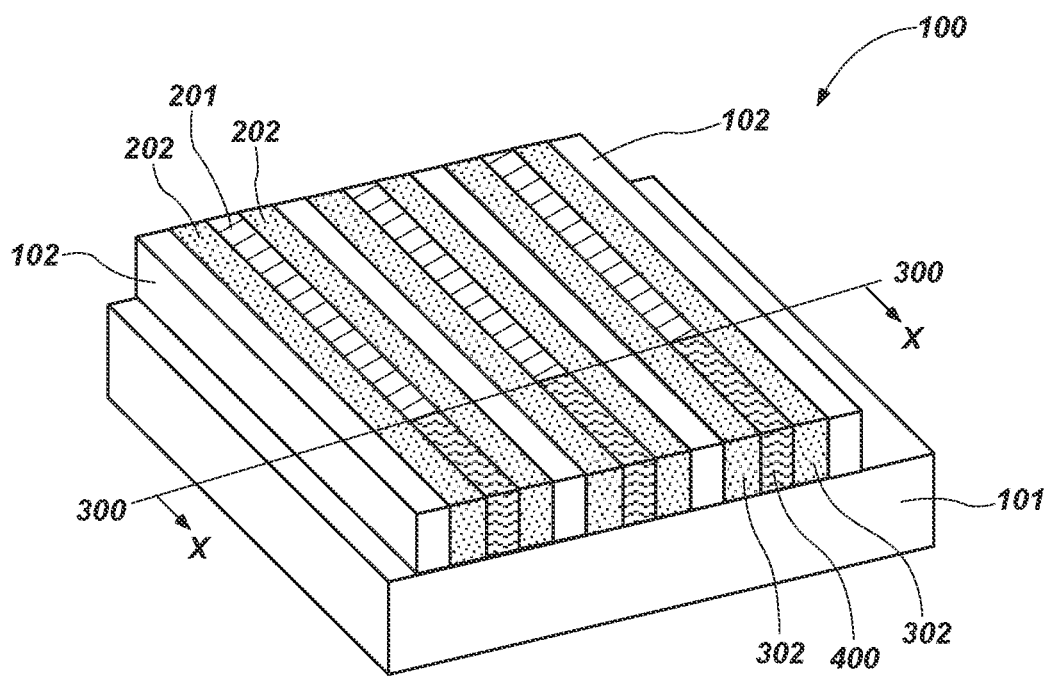

FIG. 8 shows the semiconductor structure 100 obtained by exposing the semiconductor structure 100 of FIG. 7 to a first metal oxide precursor. The generated catalyst in the catalyst-containing domains 301 may react with the first metal oxide precursor through a condensation reaction to form the first metal oxide, resulting in metal oxide-containing domains 400 that include the first block of the block copolymer material and the first metal oxide. The semiconductor structure 100 of FIG. 8 having the first metal oxide selectively incorporated in the domains 400, and not in the domains 201, 302 and matrix 202 of the semiconductor structure.

Figure 9:
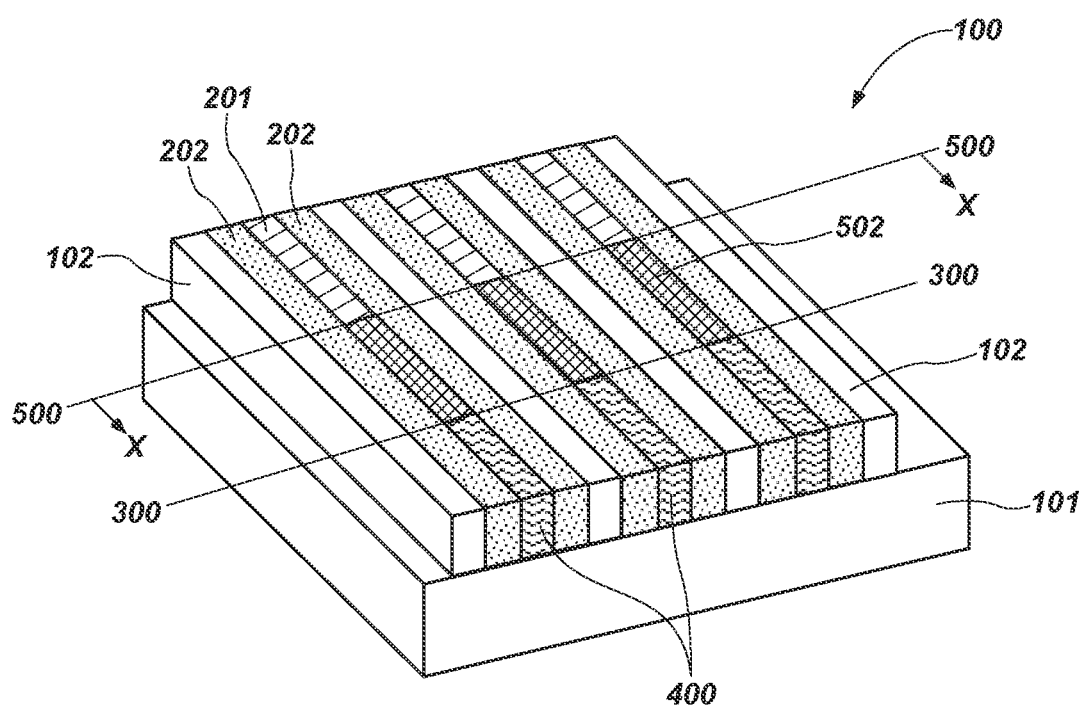

FIG. 9 shows the semiconductor structure obtained by applying activation energy to a selected portion (i.e., the area below line 500-500 in direction of "X" but above the line 300-300) of the semiconductor structure 100 of FIG. 8 to generate catalyst from the activatable catalyst in the selected portions. As shown in FIG. 9, the selected portions of the self-assembled block copolymer structure may include catalyst-containing domains 502 composed of the first block and the generated catalyst, and matrix 202 composed of the second block of the block copolymer material. The matrix 202 of the selected areas may remain substantially unchanged, since there is substantially no activatable catalyst in the matrix 202. Therefore, the self-assembled block copolymer structure of FIG. 9 may include generated acid or base selectively in the catalyst-containing domains 502, and not in the domains 201 and matrix 202.

Figure 10:
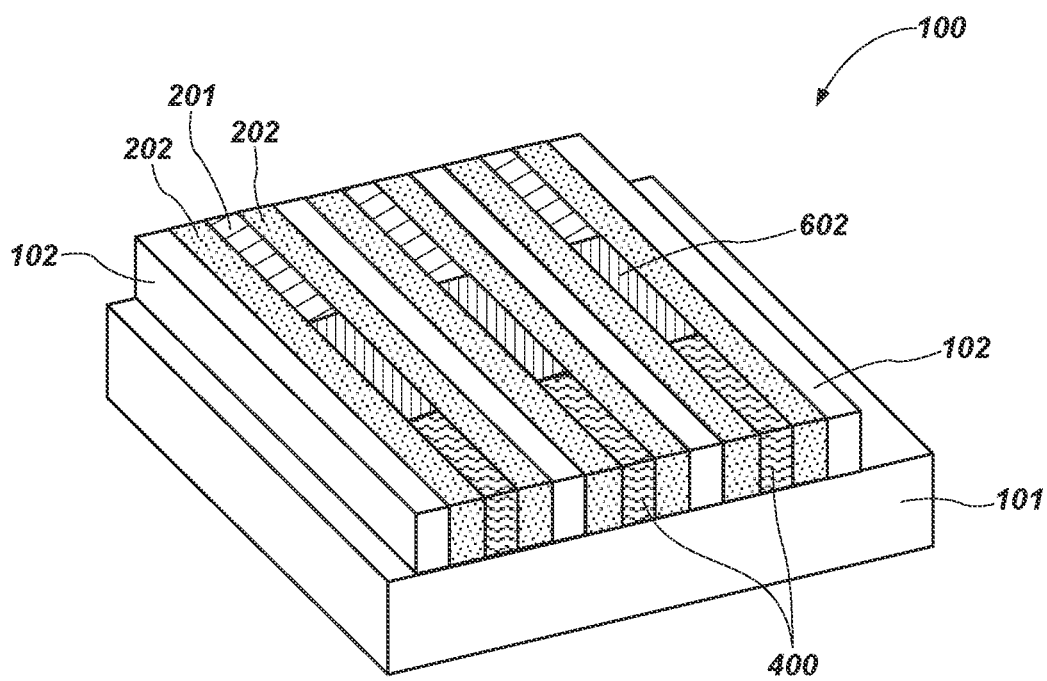

FIG. 10 shows the semiconductor structure 100 obtained by exposing the semiconductor structure 100 of FIG. 9 to a second metal oxide precursor. The catalyst in the catalyst-containing domains 502 of FIG. 9 may react with the second metal oxide precursor to provide the semiconductor structure 100 of FIG. 10 having the second metal oxide formed selectively in the metal oxide-containing domains 602, and not in the domains 400, 201 and matrix 202 of the semiconductor structure.

Figure 11:
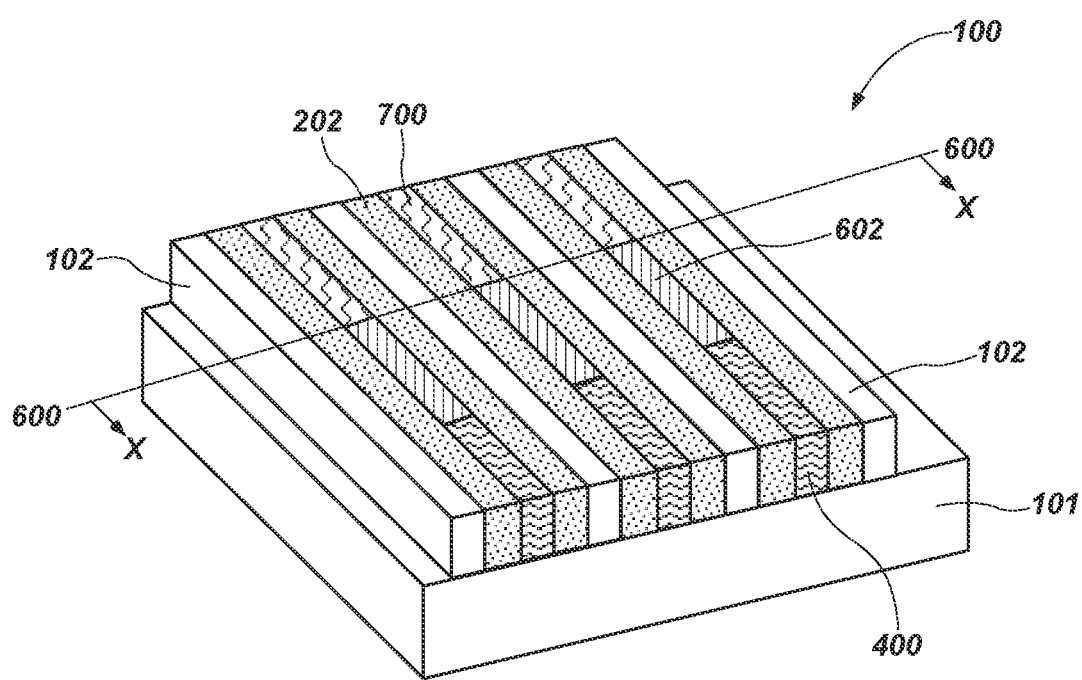

FIG. 11 shows the semiconductor structure 100 having domains 700 composed of a third metal oxide. Upon application of activation energy to the semiconductor structure 100 of FIG. 10, catalyst may be generated from the activatable catalyst in the domains 201 of FIG. 10. Consequently, upon exposure to a third metal oxide precursor, the catalyst in the domains 201 may react with the third metal oxide precursor to form the third metal oxide selectively in the area above line 600-600 in the direction of "X" of the domains 700 of the semiconductor structure 100 of FIG. 11.

Figure 12A:
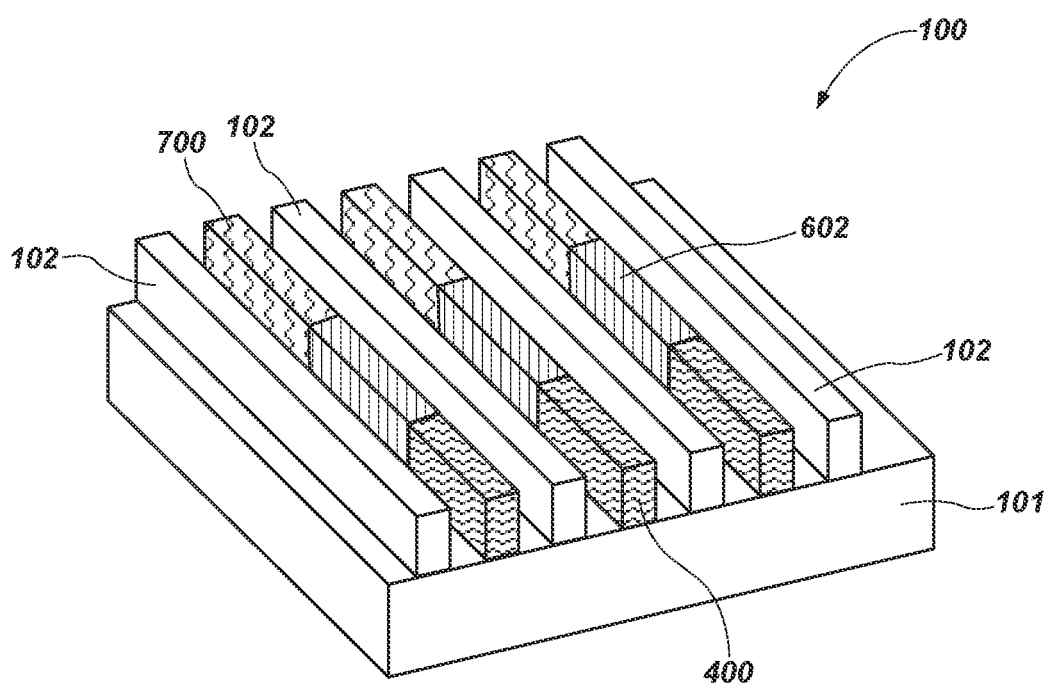

In some embodiments, as shown in FIG. 12A, the matrix 202 of the semiconductor structure 100 of FIG. 11 may be removed, leaving the domains 400 including the first block and the first metal oxide, the domains 602 including the first block and the second metal oxide, and the domains 700 including the first block and the third metal oxide on the substrate 101. The matrix 202 may be removed using any conventional process, and therefore is not described in detail herein.

Figure 12B:
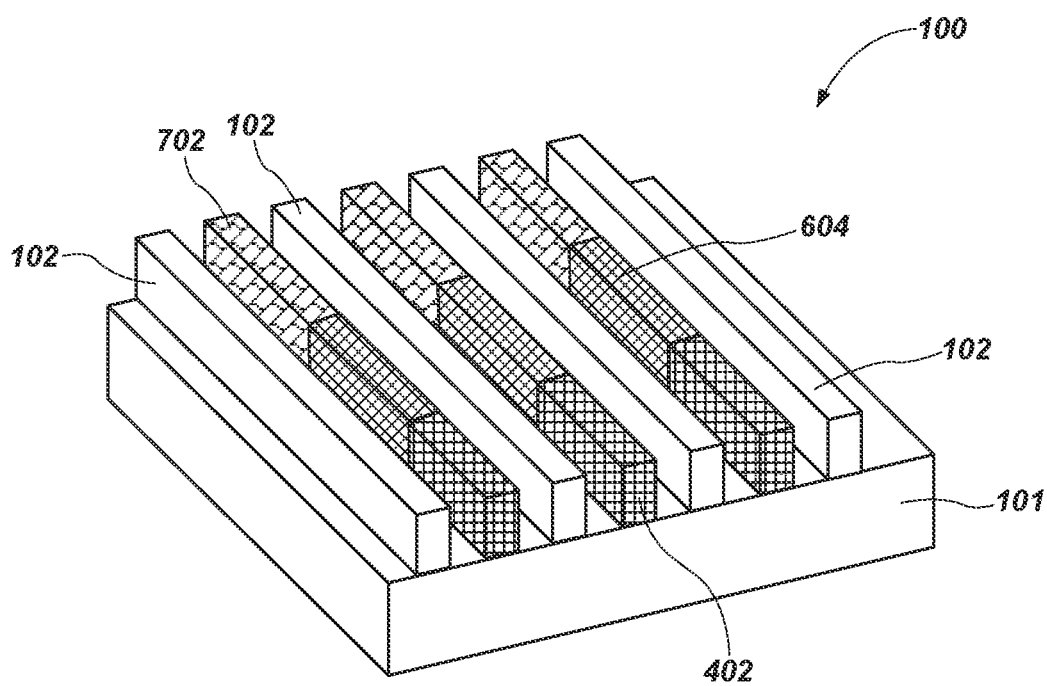

In some embodiments, as shown in FIG. 12B, the block copolymer material in the domains 400, 602, 700 and matrix 202 in the semiconductor structure 100 of FIG. 11 may be removed, leaving ordered nanostructures of the first metal oxide 402, the second metal oxide 604, and third metal oxide 702 on the substrate 101. The block copolymer material in the domains 400, 602, 700 and matrix 202 may be removed using any conventional process, and therefore is not described in detail herein.

A semiconductor structure may comprise a self-assembled nanostructure on a substrate, the self-assembled nanostructure comprising self-assembled domains in a matrix, wherein the self-assembled domains may comprise at least a first portion and a second portion, the first portion comprising a first block of a block copolymer material and a first metal oxide, the second portion comprising the first block of the block copolymer material and a second metal oxide, and wherein the matrix may comprise a second block of the block copolymer material and substantially without any metal oxide.

Although FIGS. 1-12B show that the block copolymer composition self-assembles through the graphoepitaxy technique, it is understood that the block copolymer composition may self-assemble through the chemoepitaxy technique or other techniques. Furthermore, although FIGS. 1-12B show the nanostructures in straight line features, it is understood that the nanostructures may have any other desired structures. Non-limiting examples of other structures may include zig-zag lines, curved lines, or a 1-3-1 line pattern.

FIGS. 13-17A and 17B show various stages in the preparation of nanostructures from self-assembled block copolymer material selectively permeated with metal oxides according to an embodiment of the present disclosure, wherein the block copolymer material self-assembles through chemoepitaxy technique.

Figure 13:
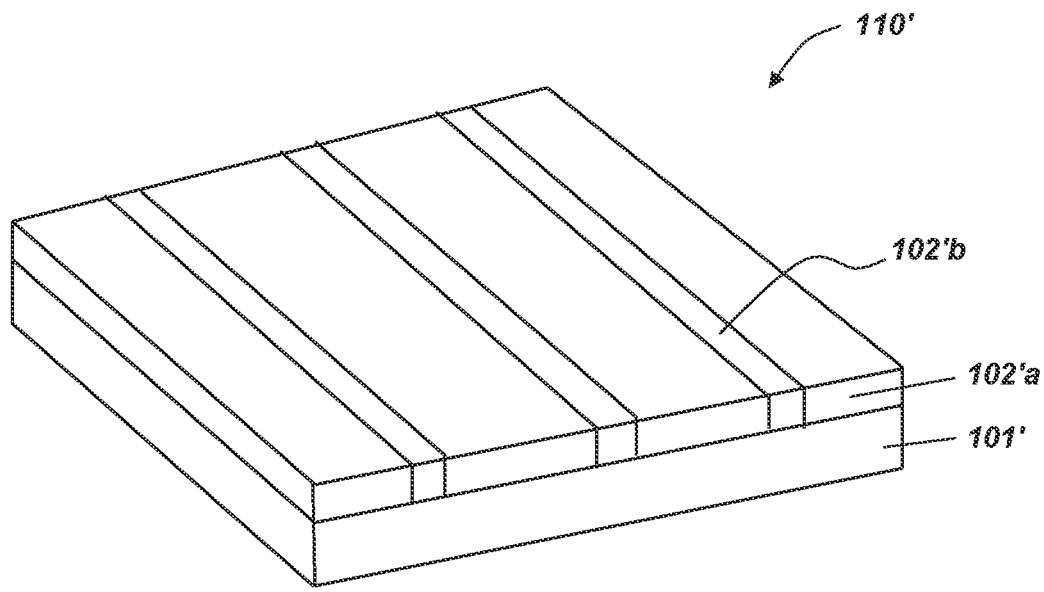

FIG. 13 shows a chemically patterned material 110' that includes a substrate 101', portions 102'a, and portions 102'b, wherein the portions 102'a are chemically different from the portions 102'b. The portions 102'b may have greater affinity to at least one polymer block of the block copolymer composition and be used to direct the self-assembly of the block copolymer composition.

Figure 14:
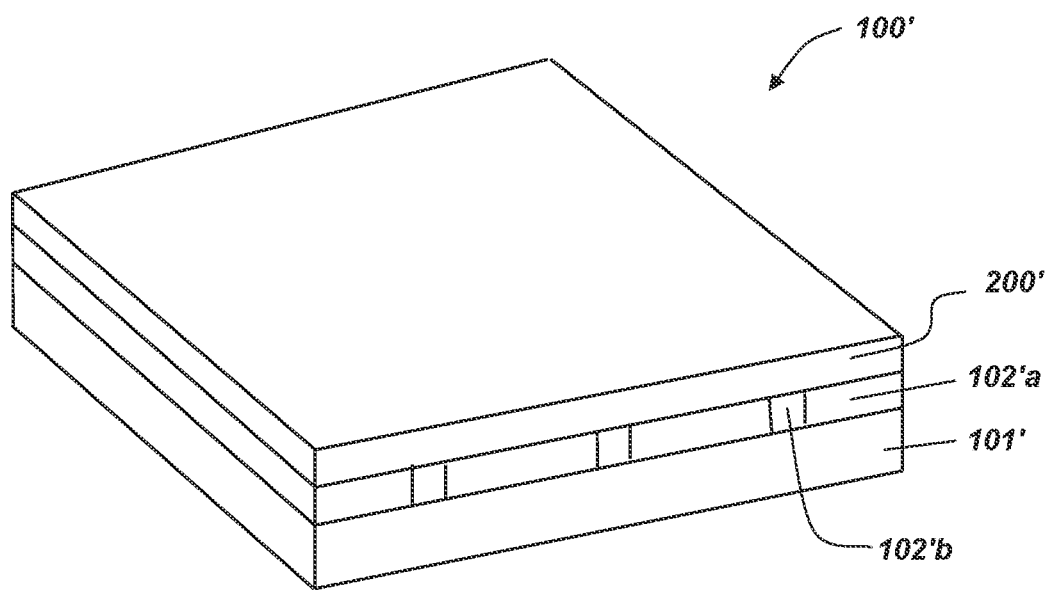

In FIG. 14, the block copolymer composition 200' is formed on the portions 102'a, 102'b of the patterned material 110'. The block copolymer composition 200' includes a block copolymer material and an activatable catalyst having a higher affinity to a more polar block of the block copolymer material than a less polar block of the block copolymer material. The portions 102'b of the patterned material 110' have chemical specificity to the more polar blocks of the block copolymer composition; whereas, the portions 102'a of patterned material 110' have chemical specificity to the less polar blocks of the block copolymer composition.

Figure 15:
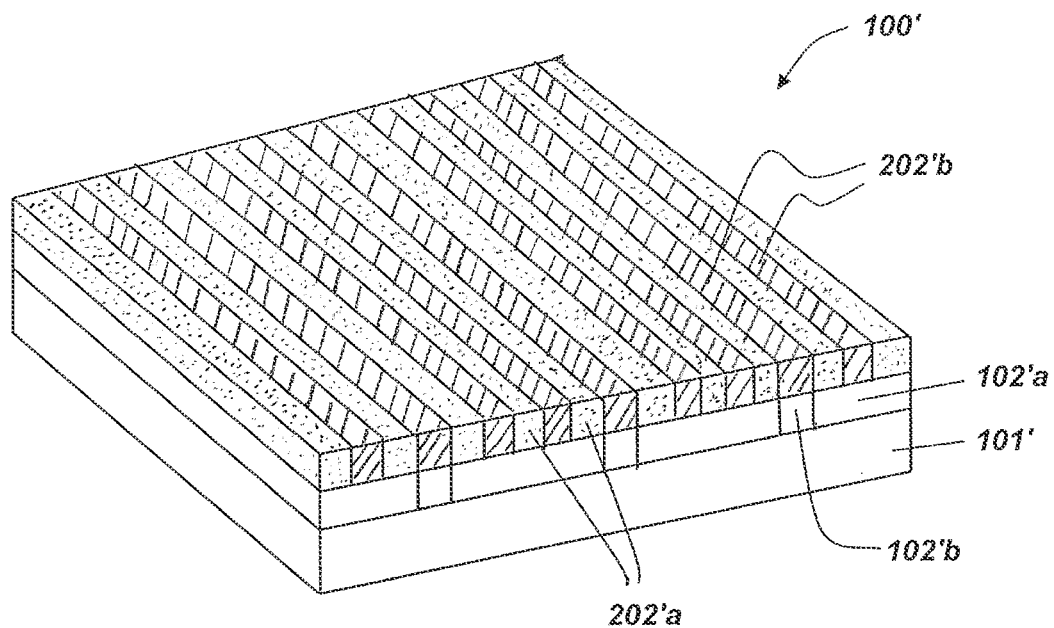

Upon subjecting a semiconductor structure 100', of FIG. 14, to microphase separation, the portions 102'a, 102'b of the patterned material 110' direct the chemoepitaxy self-assembly of the block copolymer composition 200' to provide the semiconductor structure 100' of FIG. 15. The structure of FIG. 15 includes domains 202'a over the portions 102'a of patterned material 110', and domains 202'b over the portions 102'b of patterned material 110'. The domains 202'b may include the more polar block and the activatable catalyst. The domains 202'a may include the less polar block of the block copolymer material, and are substantially lacking the activatable catalyst.

Figure 16:
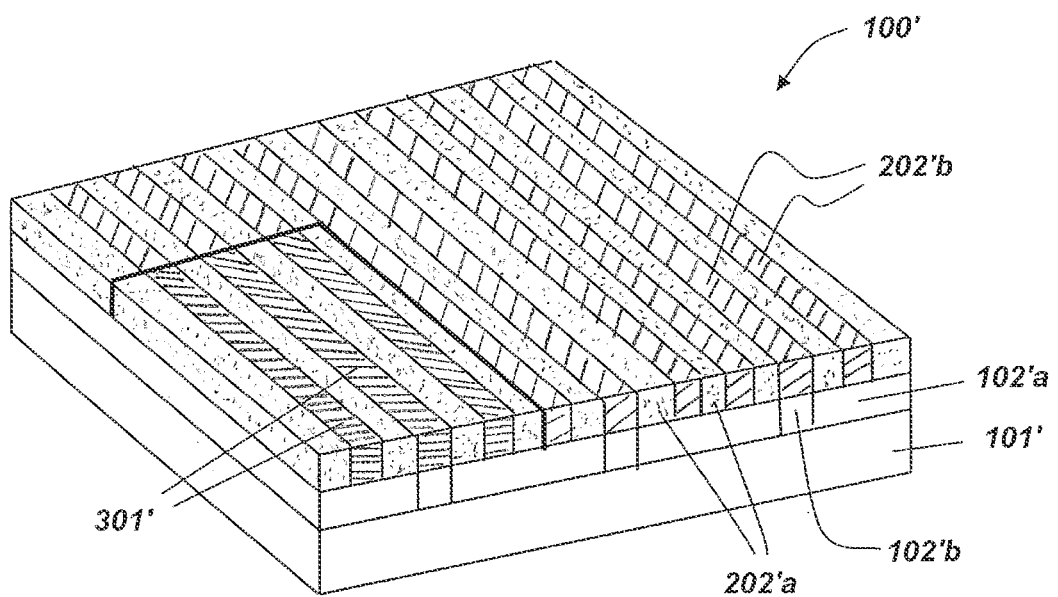

FIG. 16 shows a semiconductor structure 100' obtained by applying activation energy to selected portions of the semiconductor structure 100' of FIG. 15 to generate catalyst from the activatable catalyst in the selected portions. The semiconductor structure 100' of FIG. 16 may include domains 301' composed of the more polar block and the catalyst generated from the activatable catalyst, and domains 202'a composed of the less polar block of the block copolymer material. The domains 202'a remain unchanged after the application of activation energy, since there is substantially no activatable catalyst in the domains 202'a. The activatable catalyst in the non-activated portions (i.e., not subjected to the activation energy) remains unactivated, and therefore there is no catalyst generated in the domains 202'b. The activation energy may be selectively applied to the desired portions of the semiconductor structure 100' using any conventional technique, and therefore is not described in detail herein.

Figure 17A:
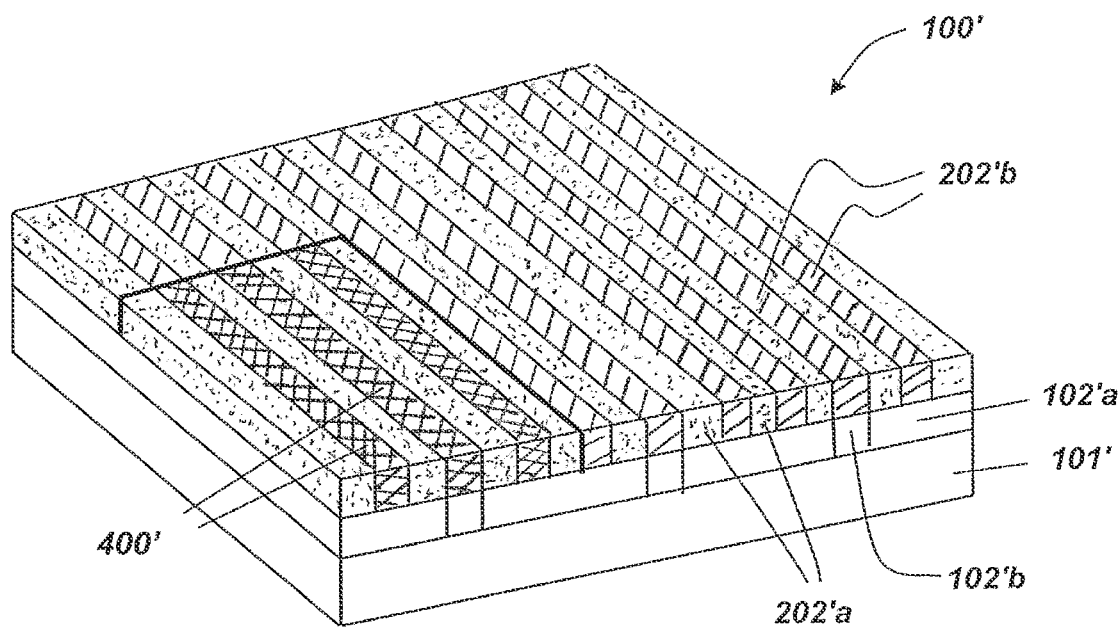

The semiconductor structure 100' of FIG. 16 may be exposed to a metal oxide precursor to provide the semiconductor structure 100' of FIG. 17A. The catalyst in the domain 301' may react with the metal oxide precursor to form self-assembled block copolymer domains 400' composed of the more polar block of the block copolymer material and metal oxide. There is substantially no metal oxide formed in domains 202'a and 202'b, since the domains 202'a have substantially no activatable catalyst, and the domains 202'b have substantially no generated catalyst.

A method of forming nano structures may comprise forming a block copolymer composition on a patterned material, wherein the block copolymer composition may comprise a block copolymer material and an activatable catalyst having higher affinity for a first block of the block copolymer material compared to a second block; self-assembling the block copolymer composition into a structure comprising domains of the first block and the activatable catalyst in a matrix of the second block; applying an activation energy to a first portion of the domains of the first block and the activatable catalyst to produce a catalyst in the first portion of the domains; and exposing the structure to a first metal oxide precursor to form a first metal oxide in the first portion of the domains.

In some embodiments, the domains 202'a, 202'b in the semiconductor structure 100' of FIG. 17A may be removed, leaving self-assembled block copolymer domains 400' composed of the more polar block of the block copolymer material and metal oxide on the patterned material 110'. The domains 202'a and 202'b may be removed using any conventional process, and therefore is not described in detail herein.

Figure 17B:
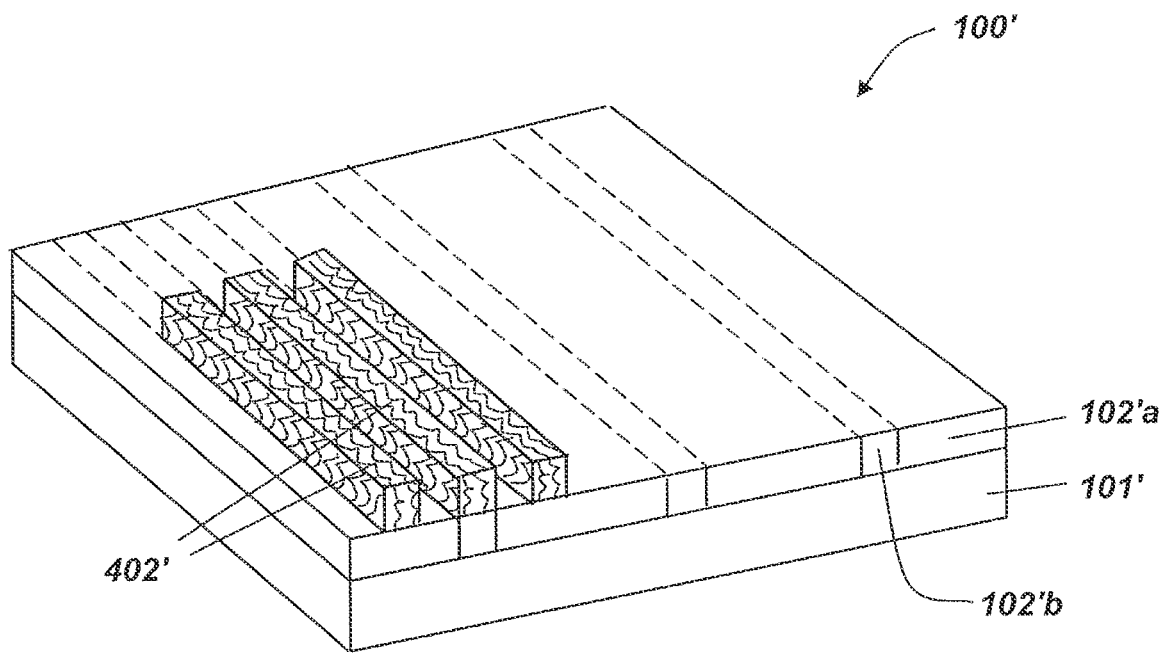

In some embodiments, as shown in FIG. 17B, the block copolymer material in the domains 202'a, 202'b and 400' in the semiconductor structure 100' of FIG. 17A may be removed, leaving ordered nanostructures 402' composed of metal oxide on the patterned material 110'. The block copolymer material in the domains 202'a, 202'b and 400' may be removed using any conventional process, and therefore is not described in detail herein. The nanostructures 402' may be subject to further processing steps to form nano-scale features for the semiconductor devices.

The semiconductor structures 100, 100' of FIGS. 6, 12A, 12B, 17A and 17B may be subjected to further processing for fabrication of a semiconductor device. In some embodiments, the semiconductor structures may be further processed by conventional techniques to form nano-scale etch masks having dimensions of less than 50 nm with improved pattern fidelity (line edge and roughness). In some embodiments, the semiconductor structures, such as those shown in FIGS. 12B and 17B, may be further processed by conventional techniques to form nano-scale metal routing or nano-scaled metal features for fabrication of a semiconductor device.

The method of forming nanostructures may provide nano-scale etch masks with improved pattern fidelity in terms of line edge and roughness, and substantially without undesirable random curvature, thereby minimizing, if not eliminating, the need of removing random curvature.

While the present disclosure is susceptible to various modifications and alternative forms, specific embodiments have been shown by way of example in the drawings and have been described in detail herein. However, the present disclosure is not intended to be limited to the particular forms disclosed. Rather, the present disclosure is to cover all modifications, equivalents, and alternatives falling within the scope of the present disclosure as defined by the following appended claims and their legal equivalents.

What is claimed is:

1. A method of forming nanostructures, comprising:
   forming a block copolymer composition on a patterned material, the block copolymer composition comprising a block copolymer material and an activatable catalyst having higher affinity for a first block of the block copolymer material compared to a second block of the block copolymer material;
   self-assembling the block copolymer composition by microphase segregation into first domains comprising the first block and the activatable catalyst, and second domains comprising the second block;

applying an activation energy to a first portion of the first domains to activate the activatable catalyst in the first portion of the first domains;

reacting a first metal oxide precursor with the activated activatable catalyst in the first portion of the first domains to form a first metal oxide in the first portion of the first domains;

applying an activation energy to a second portion of the first domains to activate the activatable catalyst in the second portion of the first domains; and reacting a second metal oxide precursor with the activated activatable catalyst in the second portion of the first domains to form a second metal oxide in the second portion of the first domains.

2. The method of claim 1, further comprising:

applying an activation energy to a third portion of the first domains to produce a catalyst in the third portion of the first domains; and reacting a third metal oxide precursor with the catalyst in the third portion of the first domains to form a third metal oxide in the third portion of the first domains.

3. The method of claim 2, further comprising removing the second domains to provide a nanostructure comprising the first portion, the second portion, and the third portion of the first domains.

4. The method of claim 3, further comprising removing the first block of the block copolymer material from the first portion, the second portion, and the third portion of the first domains to form a nanostructure comprising the first metal oxide, the second metal oxide, and the third metal oxide on the patterned material.

5. The method of claim 1, wherein applying an activation energy to a first portion of the first domains comprises applying photo energy, thermal energy, or a combination thereof to the first portion of the first domains.

6. The method of claim 1, wherein forming a first metal oxide in the first portion of the first domains comprises forming the first metal oxide comprising a metal selected from the group consisting of titanium (Ti), aluminum (Al), zirconium (Zr), hafnium (Hf), silicon (Si), and combinations thereof and forming a second metal oxide in the second portion of the first domains comprises forming the second metal oxide comprising a metal selected from the group consisting of titanium (Ti), aluminum (Al), zirconium (Zr), hafnium (Hf), silicon (Si), and combinations thereof, the metal of the first metal oxide different than the metal of the second metal oxide.

7. The method of claim 1, wherein forming a block copolymer composition on a patterned material comprises forming the block copolymer material comprising the first and second blocks, the first block being more hydrophilic than the second block.

8. The method of claim 1, wherein forming a block copolymer composition on a patterned material comprises forming the block copolymer material comprising the first and second blocks at a volume ratio of from 20:80 to 50:50.

9. The method of claim 1, wherein reacting a second metal oxide precursor with the activated activatable catalyst in the second portion of the first domains comprises forming the second metal oxide comprising a different metal than the first metal oxide.

10. A method of forming nanostructures, comprising:

forming a block copolymer composition on a patterned material, the block copolymer composition comprising a block copolymer material and an activatable catalyst having higher affinity for a first block of the block copolymer material compared to a second block of the block copolymer material;

self-assembling the block copolymer composition by microphase segregation into first domains comprising the first block and the activatable catalyst, and second domains comprising the second block;

applying an activation energy to a first portion of the first domains to activate the activatable catalyst in the first portion of the first domains and to generate activated activatable catalyst;

reacting a first metal oxide precursor with the activated activatable catalyst in the first portion of the first domains to form a first metal oxide in the first portion of the first domains comprising the first block of the block copolymer material;

applying an activation energy to a second portion of the first domains to activate the activatable catalyst in the second portion of the first domains and to generate activated activatable catalyst, the second portion of the first domains adjacent to the first portion of the first domains; and reacting a second metal oxide precursor with the activated activatable catalyst in the second portion of the first domains to form a second metal oxide in the second portion of the first domains, the second metal oxide comprising a different metal than the first metal oxide.

11. The method of claim 10, further comprising:

applying an activation energy to a third portion of the first domains to activate the activatable catalyst in the third portion of the first domains and to generate activated activatable catalyst; and reacting a third metal oxide precursor with the activated activatable catalyst in the third portion of the first domains to form a third metal oxide in the third portion of the first domains.

12. The method of claim 11, further comprising removing the second domains to produce a nanostructure comprising the first metal oxide, the second metal oxide, and the third metal oxide.

13. The method of claim 10, wherein reacting a first metal oxide precursor with the activated activatable catalyst in the first portion of the first domains and reacting a second metal oxide precursor with the activated activatable catalyst in the second portion of the first domains comprises forming substantially no first metal oxide or second metal oxide in the second domains comprising the second block.

14. The method of claim 10, wherein forming a block copolymer composition on a patterned material, the block copolymer composition comprising a block copolymer material and an activatable catalyst comprises forming the block copolymer composition comprising the block copolymer material and the activatable catalyst selected from the group consisting of a photo acid generator (PAG), a thermal acid generator (TAG), a photo base generator (PBG), a thermal base generator (TBG), and a mixture thereof.

15. The method of claim 10, wherein self-assembling the block copolymer composition by microphase segregation into first domains comprising the first block and the activatable catalyst, and second domains comprising the second block comprises self-assembling the block copolymer composition by graphoepitaxy or by chemoepitaxy.

16. The method of claim 10, wherein forming a block copolymer composition on a patterned material comprises forming the block copolymer composition comprising a relatively more polar block and a relatively less polar block on the patterned material.

17. The method of claim 10, wherein reacting a second metal oxide precursor with the activated activatable catalyst in the second portion of the first domains comprises forming the second metal oxide directly adjacent to the first metal oxide.

18. The method of claim 10, wherein reacting a second metal oxide precursor with the activated activatable catalyst in the second portion of the first domains comprises forming the second metal oxide in the second portion of the first domains without forming the second metal oxide in the second domains.

* * * * *